United States Patent
Yan et al.

(10) Patent No.: US 10,263,206 B2
(45) Date of Patent: Apr. 16, 2019

(54) ORGANIC SEMICONDUCTOR CRYSTALLINE FILM, METHOD FOR PREPARING THE SAME, ORGANIC TRANSISTOR, AND ORGANIC PHOTOTRANSISTOR

(75) Inventors: Donghang Yan, Changchun (CN); Haibo Wang, Changchun (CN); Feng Zhu, Changchun (CN); Jianwu Shi, Changchun (CN); De Song, Changchun (CN)

(73) Assignee: Changchun Institute of Applied Chemistry Chinese Academy of Sciences, Changchun (CN)

( * ) Notice: Subject to any disclaimer, the term of this patent is extended or adjusted under 35 U.S.C. 154(b) by 0 days.

(21) Appl. No.: 11/788,957

(22) Filed: Apr. 21, 2007

(65) Prior Publication Data

US 2007/0262303 A1  Nov. 15, 2007

(30) Foreign Application Priority Data

Apr. 29, 2006 (CN) .......................... 2006 1 0016822

(51) Int. Cl.
*H01L 51/00* (2006.01)
*H01L 51/42* (2006.01)
*H01L 51/05* (2006.01)

(52) U.S. Cl.
CPC ........ *H01L 51/428* (2013.01); *H01L 51/0012* (2013.01); *H01L 51/0068* (2013.01);
(Continued)

(58) Field of Classification Search
CPC ............. H01L 51/0545; H01L 51/0014; H01L 51/0012; H01L 51/428; Y02E 10/549
(Continued)

(56) References Cited

U.S. PATENT DOCUMENTS 5,561,030 A * 10/1996 Holdcroft et al. ............ 430/311
6,107,117 A *  8/2000 Bao et al. ...................... 438/99
(Continued)

FOREIGN PATENT DOCUMENTS

| CN | 200510016895.9 | 2/2006 |
|----|----------------|--------|
| CN | 200510119001.9 | 7/2006 |
| CN | 200510119064.4 | 7/2006 |

OTHER PUBLICATIONS

Frank J. Meyer Zu Herlingdorf, M.C . Reuter & R.M. Tromp, Growth Dynamics of Pentacene Thin Films, Nature, vol. 412, Aug. 2, 2001 pp. 517-590.
(Continued)

*Primary Examiner* — Mary A Wilczewski
*Assistant Examiner* — Tsz K Chiu
(74) *Attorney, Agent, or Firm* — Rosenberg, Klein & Lee

(57) ABSTRACT

An organic semiconductor crystalline film and weak oriented epitaxy growth preparation method thereof. The organic semiconductor crystalline film is a n-type semiconductor or a p-type semiconductor, and organic semiconductor crystal molecules in the organic semiconductor crystalline film are oriented in a stand-up manner on the ordered substrate, and have an oriented relationship with the ordered substrate. The organic semiconductor crystalline film prepared by the present invention is useful for organic transistor and organic phototransistor devices. The method of the present invention can control the high carrier mobility direction of organic semiconductor crystals to have ordered orientation in the film, enhance contacts between crystals, improve mechanical strength and micro-machining property of the film, and give a high carrier mobility. The carrier mobility of weak oriented epitaxially grown film of the present invention is 0.32 cm$^2$/Vs, which is 5 times as large as that of a vapor phase deposited film, and is similar to that
(Continued)

of single crystal. The present invention is adapted to glass substrates and plastic substrates.

7 Claims, 8 Drawing Sheets

(52) U.S. Cl.
CPC ...... *H01L 51/0078* (2013.01); *H01L 51/0545* (2013.01); *Y02E 10/549* (2013.01)

(58) Field of Classification Search
USPC .......................................... 257/40; 538/377
See application file for complete search history.

(56) References Cited

U.S. PATENT DOCUMENTS

| | | | | |
|---|---|---|---|---|
| 6,278,127 | B1* | 8/2001 | Dodabalapur et al. | 257/40 |
| 6,433,359 | B1* | 8/2002 | Kelley | B82Y 10/00 257/40 |
| 6,885,024 | B2* | 4/2005 | Bao | H01L 51/0545 257/40 |
| 7,067,841 | B2* | 6/2006 | Parker | 257/40 |
| 7,189,987 | B2* | 3/2007 | Bao | G01N 27/4145 257/252 |
| 7,847,284 | B2* | 12/2010 | Hanna | C08K 5/0008 257/40 |
| 7,851,344 | B2* | 12/2010 | Kugler | B82Y 20/00 257/E21.575 |
| 8,134,143 | B2* | 3/2012 | Drolet | B82Y 10/00 252/301.35 |
| 8,518,738 | B2* | 8/2013 | Sirringhaus | H01L 51/0012 257/E51.024 |
| 9,490,439 | B2* | 11/2016 | Wierzchowiec | H01L 51/107 |
| 9,614,158 | B2* | 4/2017 | Sirringhaus | H01L 51/0034 |
| 2002/0187312 | A1 | 12/2002 | Fonash et al. | 428/195 |
| 2003/0071259 | A1* | 4/2003 | Yoshida | 257/40 |
| 2004/0048092 | A1* | 3/2004 | Yasui et al. | 428/642 |
| 2004/0108562 | A1* | 6/2004 | Nagayama et al. | 257/434 |
| 2004/0150050 | A1* | 8/2004 | Yan et al. | 257/368 |
| 2004/0161873 | A1* | 8/2004 | Dimitrakopoulos et al. | 438/99 |
| 2005/0138804 | A1* | 6/2005 | Hasegawa et al. | 29/847 |
| 2005/0159580 | A1* | 7/2005 | Liu et al. | 528/373 |
| 2006/0214312 | A1* | 9/2006 | Wu et al. | 257/787 |
| 2006/0231954 | A1* | 10/2006 | Yan et al. | 257/744 |
| 2006/0237731 | A1* | 10/2006 | Furukawa et al. | 257/83 |
| 2007/0272919 | A1* | 11/2007 | Mori et al. | 257/40 |
| 2009/0111210 | A1* | 4/2009 | Obuchi et al. | 438/99 |

OTHER PUBLICATIONS

Jean Calude Wittman & Paul Smith, Highly Oriented Thin Films of Poly(tetrafluoroethylene) as a Substrate for Oriented Growth of Materials, Nature, vol. 352 Aug. 1, 1991, pp. 414-417.
Beng S. Ong, Yiliang Wu, Ping Liu & Sandra Gardner, High-Performance Semiconducting Polythiophenes for Organic Thin-Film Transistors, J.Am.Chem.Soc. 2004, vol. 126, pp. 3378-3379.
Howard E. Katz & Donald J. Cram, Host-Guest Complexation.30. Quinquaryl and Bis(urea) Binders, J.Am.Chem.Soc. 1984, vol. 106 pp. 4977-4987.
Givanna Barbarella, Laura Favaretto, Fiovanna Sotgiu, Massimo Zambianchi, Valeria Fattori, Massimo Cocchi, Franco Cacialli, Giuseppe Giglt & Roberto Cingolani, Modified Oligothiophenes with High Photo-and Electroluminescence Efficiencies, Adv.Mater, 1999, vol. 11, No. 16, pp. 1375-1379.
Yanhou Geng, Andrew C.A. Chen, Jane J. Ou, Shaw H. Chen, Kevii Klubek, Kathleen M. Vaeth & Ching W. Tang, Monodisperse Glassy-Nematic Conjugated Oligomers with Chemically Tunable Polarized Light Emission, Chem. Matter 2003, vol. 15, No. 23, pp. 4352-4360.

X. Linda Chen, Andrew J. Lovinger, Zhenan Bao & Joyce Sapjeta, Morphological and Transistor Studies of Organic Molecular Semiconductors with Anisotropic Electrical Characteristics, Chem. Matter 2001, vol. 13, No. 4, pp. 1341-1348.
Jian Zhang, Jun Wang, Haibo Wang, & Donghang Yan, Organic Thin-Film Transistors in Sanwich Configuration, Applied Physics Letters, vol. 84, No. 1, Jan. 5, 2004, pp. 142-144.
CH. Kloc, P.G. Simpkins, T. Siegrist & R.A. Laudise, Physical Vapor Growth of Centimeter-Sized Crystals of α-Hexathiophene, Journal of Crystal Growth 182 (1997) pp. 416-427.
Peter Baurele, Frank Wurthner, Gunther Gotz & Franz Effenberger, Selective Synthesis of α-Substituted Oligothiophenes, Synthesis, Nov. 1993, pp. 1099-1103.
Hisao Yanagi & Takayuki Morikawa, Self-Waveguided Blue Light Emission in ρ-Sexiphenyl Crystals Epitaxially Grown by Mask-Shadowing Vapor Deposition, Applied Physics Letters, vol. 75, 2, pp. 187-189.
J.C. Wittmann, C. Straupe, S. Meyer, B. Lotz, P. Lang, G. Horowitz & F. Garnier, Sexithiophene Thin Films Epitaxially Oriented on Polvtetrafluoroethylene Substrates: Structure and Morphology, Thin Solid Films 333 (1998), pp. 272-277.
R. Zeis, T. Siegrist & CH. Kloc, Single-Crystal Field-Effect Transistors Based on Copper Phthalocanine, Applied Physics Letters 86 (2005), pp. 022103-1 thru 022103-3.
Do Hwan Kim, Joong Tark Han, Yeong Don Park, Yunseok Hang, Jeong Ho Cho, Minkyu Hwang & Kilwon Cho, Single-Crystal Polythiophene Microwires Grown by Self-Assembly, Ad. Matter 2006, vol. 18, pp. 719-723.
H.E. Katz, L. Torsi & A. Dodabalapur, Synthesis, Material Properties, and Transistor Performance of Hight Pure Thiophene Oligomers, Chem.Mater. 1995, vol. 7, No. 12, pp. 2235-2237.
S. Hotta, H. Kimura, S.A. Lee & T. Tamaki, Synthesis of Thiophene/phenylene Co-oligomers II [1], Block and Alternating Co-Oligomers, J.Heterocyclic Chem. vol. 37. (2000). pp. 281-286.
Shinzo Kano, Yoko Yuasa, Tsutomu Yokomatsu & Shiroshi Shibuya Synthesis of 2-Substituted 3, 5-Dibromothiophenes Through . Base-Catalyzed Halogen Dance Reaction of 2, 5-Dibromothiophene, Heterocycles, vol. 20, No. 10 (1983), pp. 2035-2037.
Antonio Facchetti, Yvonne Deng, Anchuan Wang, Yoshihiro Koide, Henning Sirringhaus, Tobin J. Marks & Richard H. Friend, Tuning The Semiconducting Properties of Sexithiophene by α, ω-Diperfluorohexylsexithiophene: The First n-Type Sexithiophene for Thin-Film Transistors, Angew.Chem.Int.Ed. 2000, vol. 39, No. 24, pp. 4547-4551.
Stephen R. Forrest, Ultrathin Organic Films Grown by Organic Molecular Beam Deposition and Related Techniques, Chem. Rev. 1997, vol. 97, No. 6, pp. 1793-1896.
Haibo Wang, Feng Zhu, Junliang Yang, Yanhou Geng & Donghang Yan, Weak—Epitaxy Growth Affording High—Mobility. Thin Films of Disk-Like Organic Semiconductors, Adv. Mater. 2007, vol. 19 pp. 2168-2171.
Junliang Yang and Donghang Yan, Weak Epitaxy Growth of Organic Semiconductor Thin Films, Chem.Soc.Rev. 2009, vol. 38, pp. 2634-2645.
C.W. Tang, Two-Layer Organic Photovoltaic Cell, Appl. Phys. Lett. vol. 48, No. 2, Jan. 13, 1986, pp. 183-185.
Zhenan Bao, Andrew J. Lovinger and Ananth Dodabalapur, Organic Field-Effect Transistors with High Mobility Based on Copper Phthalocyanine, Appl. Phys. Lett. 69, vol. 20, Nov. 11, 1996, pp. 3066-3068.
Masato Ofuji, Ken Ishikawa and Hideo Takezoe, Crystallite Size Effect on the Hole Mobility of Uniaxially Aligned Copper Phthalocyanine Thin-Film Field-Effect Transistors, App. Phys. Lett. vol. 86 (2005), pp. 062114-1 to 062114-3.
Haibo Wang, Feng Zhu, Junliang Yang, Yanhou Geng and Donghang Yan, Weak Epitaxy growth Affording High-Mobility Thin Films of Disk-Like Organic Semiconductors, Adv. Mater, 2007, vol. 19, pp. 2168-2171.
Shuhong Liu, Wechung Maria Wang, Alejandro L. Briseno, Stefan C.B. Mannsfeld and Zhenan Bao, Controlled Deposition of Crys-

(56) References Cited

OTHER PUBLICATIONS talline Organic Semiconductors for Field-Effect-Transistor Applications, Adv. Mater. 2009, vol. 21, pp. 1-16.

* cited by examiner

ORGANIC SEMICONDUCTOR CRYSTALLINE FILM, METHOD FOR PREPARING THE SAME, ORGANIC TRANSISTOR, AND ORGANIC PHOTOTRANSISTOR

CROSS RELATED APPLICATIONS

This application claims priority from Chinese Patent Application Serial No. 200610016822.4 filed Apr. 29, 2006.

BACKGROUND OF THE INVENTION

Field of the Invention

The present invention relates to an organic semiconductor crystalline film, a weak oriented epitaxy growth preparation method for preparing the same, and an organic film electronic device such as organic transistor and organic phototransistor comprising the organic crystalline film prepared by the weak oriented epitaxy growth method.

Background Art

In recent years, organic semiconductor materials with high carrier mobility properties and exhibit great potential in the markets of information displays, integrated circuits, photovoltaic cells and sensors. The high carrier mobility property is mainly reflected by organic semiconductor single crystal. The "Physical Vapor Growth" for preparing an organic semiconductor single crystal was reported firstly by Kloc et al., Journal of Crystal Growth, 1997, 182, 416-427.

However, the devices in the practice are required generally to be integrated, and organic semiconductor materials are usually used in the form of films in the devices. Therefore, the "Vapor Phase Deposition" facilitating the preparation of films of a large size becomes a primary method to prepare organic semiconductor polycrystalline films at present. The major controlling factors of single domains polycrystalline films of a large size prepared by vapor phase deposition method are the increase of film growth temperature and the chemical modification of surface (Nature, 2001, 412, 517-520). Because there is no oriented relationship between the organic film prepared by vapor phase deposition method and the substrate, the grain boundary defects can not be controlled effectively, and therefore the carrier mobility of thus prepared organic semiconductor polycrystalline film is lower than that of its single crystal by one order or more. Actually, in the early stage, the preparation technique of controlling the oriented relationship between an organic film and a substrate borrows ideas from the preparation methods of inorganic semiconductor films, in which organic molecular beam epitaxy (OMBE) is a representational one.

In general, the organic molecular beam epitaxy means a technology for growing an organic crystal with a commemsurable modulation and non-commemsurable modulation relationship on a single crystal substrate on the surface of the single crystal substrate (Chem. Rev., 1997, 97, 1793-1896), wherein a relatively low growth temperature is adopted in the early stage, and the sizes of crystals are small, usually about tens of nm, and the organic molecule are grown generally by lying on the substrate; recently, room temperature and high temperature growth methods are employed in the organic molecular beam epitaxy growth, resulting in the increase of crystal sizes, but the organic molecule are grown generally by lying on the substrate, too (Appl. Phys. Lett., 1999, 75, 187-189).

Since an organic molecule is in a geometric form, the epitaxy growth theory of inorganic film cannot be applied directly to the preparation of organic films, and the organic polycrystalline films prepared by this method are not continuous. The oriented polytetrafluoroethylene film method was first employed by Wittman et al. (Nature, 1991, 352, 414-417) to achieve an "Oriented Epitaxy Growth (OEG)" of polymer crystals and organic molecule crystals, which is called herein as "Strong Oriented Epitaxy Growth (SOEG)". Because of the strong interaction between polytetrafluoroethylene and the epitaxially grown polymer and organic molecules, the molecules in an oriented epitaxially grown crystal are generally arranged parallel to the substrate. As for organic semiconductor, the property of high carrier mobility in the crystal is in the direction of larger inter-molecule π-π interaction. Therefore, as compared with molecular vapor phase deposited film, a better property of carrier mobility is not obtained by the organic semiconductor polycrystalline film grown by polytetrafluoroethylene oriented epitaxy growth method (Thin solid films, 1998, 333, 272; Chem. Mater., 2001, 13, 1341-1348).

SUMMARY OF THE INVENTION

In order to overcome the deficiency of the prior art, an organic semiconductor crystalline film is provided in the present invention. The organic semiconductor crystalline film of the present invention is characterized in that organic semiconductor molecules in the organic semiconductor crystalline film are arranged in a stand-up manner on an ordered substrate, and have oriented relationship with the ordered substrate, i.e., the crystalline direction with larger inter-molecular π-π interaction is orderly oriented in the film plane, thus the organic semiconductor crystalline film possesses single crystal-like high mobility property.

Accordingly, the invention provides:

1. An organic semiconductor crystalline film (5), wherein organic semiconductor molecules in the organic semiconductor crystalline film (5) are arranged in a stand-up manner on an ordered substrate (9) and have oriented relationship with the ordered substrate (9).

2. The organic semiconductor crystalline film according to item 1, wherein the ordered substrate (9) comprises a substrate (8) and an ordered molecular layer (4), the organic semiconductor crystalline film (5) being contacted with the ordered molecular layer (4) of the ordered substrate (9).

3. The organic semiconductor crystalline film according to item 2, wherein the ordered molecular layer (4) is a p-type organic semiconductor ordered multi-molecular layer.

4. The organic semiconductor crystalline film according to item 2, wherein the ordered molecular layer (4) is a p-type organic semiconductor ordered mono-molecular layer, the ordered mono-molecular layer (4) being continuous or discontinuous.

5. The organic semiconductor crystalline film according to item 3 or 4, wherein the ordered molecular layer (4) is consisted of one of BP2T, NaT4, pentacene, hexathiophene, para-hexaphenyl (6P) or triphenanthrene.

6. The organic semiconductor crystalline film according to item 1 using one or two materials selected from p-type semiconductor material including copper phthalocyanine (CuPc), zinc phthalocyanine (ZnPc), nickel phthalocyanine (NiPc), cobalt phthalocyanine (CoPc), free phthalocyanine ($H_2$Pc), platinum phthalocyanine (PtPc), lead phthalocyanine (PbPc), Pentacene, 6P, BP2T, 5,5'-di(2-naphthyl)-2,2'-dithiophene (NaT2), 5,5''-di(2-naphthyl)-2,2':5',2''-trithiophene (NaT3), NaT4, 5,5''''-di(2-naphthyl)-2,2':5',2'':5'',2''':5''',2'''':5'''',2'''''-pentathiophene (NaT5), 5,5'''''-di(2-naphthyl)-2,2': 5',2'':5'',2''':5''',2'''':5'''',2'''''-hexathiophene (NaT6), 2,5-di(2-naphthyl)-[3,2-b]bidithiophene (NaTT), 5,5'-di(2-naphthyl)-

2,2'-di[3,2-b]bidithiophene (NaTT2), 5,5'-di(2-thianaphthenyl)-2,2'-dithiophene (TNT2), 5,5'''-di(2-thianaphthenyl)-2,2':5',2''-trithiophene (TNT3), 5,5''''-di(2-thianaphthenyl)-2,2':5',2'':5'',2'''-tetrathiophene (TNT4), 5,5'''''-di(2-thianaphthenyl)-2,2':5',2'':5'',2''':5''',2''''-pentathiophene (TNT5), 2,5-di(2-thianaphthenyl)-[3,2-b]bidithiophene (TNTT), 5,5'-di(2-thianaphthenyl)-2,2'-di[3,2-b]bidithiophene (TNTT2), 5,5'-di(2-phenanthryl)-2,2'-dithiophene (PhT), 5,5''-di(2-phenanthryl)-2,2':5',2''-trithiophene (PhT3), 5,5'''-di(2-phenanthryl)-2,2':5',2'':5'',2'''-tetrathiophene (PhT4), 2,5-di(2-phenanthryl)-[3,2-b]bidithiophene (PhTT), or 5,5'-di(2-phenanthryl)-2,2'-di[3,2-b]bidithiophene (PhTT2), and n-type semiconductor material including copper fluorophthalocyanine ($F_{16}$CuPc), zinc fluorophthalocyanine ($F_{16}$ZnPc), iron fluorophthalocyanine ($F_{16}$FePc), cobalt fluorophthalocyanine ($F_{16}$CoPc) or fluoro-hexathiophene (DFH-6T).

7. A method for preparing the organic semiconductor crystalline film according to item 1, comprising the steps of preparing the ordered substrate (9) and preparing the organic semiconductor crystalline film (5) grown thereon, wherein the interaction between epitaxial molecules in the organic semiconductor crystalline film (5) and the ordered substrate (9) is controlled by growth temperature to be weaker than the interaction between epitaxial molecules, so that the epitaxial molecules in the organic semiconductor crystalline film (5) are epitaxially grown in a stand-up manner on the ordered substrate (9), and the crystalline direction with larger inter-molecular π-π interaction is orderly oriented in the film plane.

8. The method for preparing an organic semiconductor crystalline film according to item 7, wherein the step of preparing the ordered substrate (9) comprises depositing an organic semiconductor ordered molecular layer (4) on a glass or plastic substrate (8) wherein the temperature of the substrate is within 30-200° C. to constitute an ordered substrate (9) by using molecular vapor phase deposition method; and the step of preparing the organic semiconductor crystalline film (5) comprises depositing the organic semiconductor crystalline film (5) on the organic semiconductor ordered molecular layer (4) of the ordered substrate (9) at a temperature of 30-200° C. by using molecular vapor phase deposition method.

9. An organic transistor, comprising a substrate (1), a gate electrode (2), a insulator gate (3), an ordered mono-molecular layer (4), a organic semiconductor crystalline film (5), and source/drain electrodes (6), wherein the substrate (1) is contacted with the gate electrode (2), the gate electrode (2) is contacted with the insulator gate (3), the insulator gate (3) is contacted with the source/drain electrodes (6), the ordered mono-molecular layer (4) is contacted with the insulator gate (3) and the source/drain electrodes (6), and the ordered mono-molecular layer (4) is contacted with the organic semiconductor crystalline film (5), wherein the organic semiconductor crystalline film (5) is an organic semiconductor crystalline film according to item 1.

10. A organic phototransistor, comprising a substrate (1), a gate electrode (2), a insulator gate (3), an ordered mono-molecular layer (4), a organic semiconductor crystalline film (5), and source/drain electrodes (6), wherein the substrate (1) is contacted with the gate electrode (2), the gate electrode (2) is contacted with the insulator gate (3), the insulator gate (3) is contacted with the source/drain electrodes (6), the ordered mono-molecular layer (4) is contacted with the insulator gate (3) and the source/drain electrodes (6), the ordered mono-molecular layer (4) is contacted with the organic semiconductor crystalline film (5) is an organic semiconductor crystalline film according to item 1.

11. An organic transistor, comprising a substrate (1), a gate electrode (2), a insulator gate (3), an ordered mono-molecular layer (4), a organic semiconductor crystalline film (5), and source/drain electrodes (6), wherein the substrate (1) is contacted with the gate electrode (2), the gate electrode (2) is contacted with the insulator gate (3), the insulator gate (3) is contacted with the source/drain electrodes (6), the ordered mono-molecular layer (4) is contacted with the insulator gate (3) and the source/drain electrodes (6), the ordered mono-molecular layer (4) is contacted with the organic semiconductor crystalline film (5), wherein the substrate (1) is contacted with the gate electrode (2), the gate electrode (2) is contacted with the insulator gate (3), the insulator gate (3) is contacted with the ordered mono-molecular layer (4), the ordered mono-molecular layer (4) is contacted with the organic semiconductor crystalline film (5), and the organic semiconductor crystalline film (5) is contacted with source/drain electrodes (6), wherein the organic semiconductor crystalline film (5) is an organic semiconductor crystalline film according to item 1.

12. A organic phototransistor, comprising a substrate (1), a gate electrode (2), a insulator gate (3), an ordered mono-molecular layer (4), a organic semiconductor crystalline film (5), and source/drain electrodes (6), wherein the substrate (1) is contacted with the gate electrode (2), the gate electrode (2) is contacted with the insulator gate (3), the insulator gate (3) is contacted with the source/drain electrodes (6), the ordered mono-molecular layer (4) is contacted with the insulator gate (3) and the source/drain electrodes (6), the ordered mono-molecular layer (4) is contacted with the organic semiconductor crystalline film (5), wherein the substrate (1) is contacted with the gate electrode (2), the gate electrode (2) is contacted with the insulator gate (3), the insulator gate (3) is contacted with the ordered mono-molecular layer (4), the ordered mono-molecular layer (4) is contacted with the organic semiconductor crystalline film (5), and the organic semiconductor crystalline film (5) is contacted with source/drain electrodes (6), wherein the organic semiconductor crystalline film (5) is an organic semiconductor crystalline film according to item 1.

BRIEF DESCRIPTION OF THE DRAWINGS

The various embodiments, features and advances of the present invention will be understood more completely hereinafter as a result of a detailed description thereof in which reference will be made to the following drawings.

DETAILED DESCRIPTION OF PREFERRED EMBODIMENTS

Figure 1A:
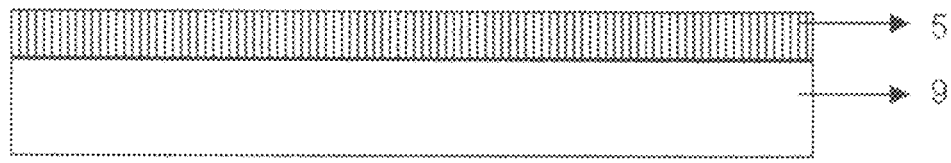
FIG. 1A is a schematic view of a structure of an organic semiconductor crystalline film.
Figure 1B:
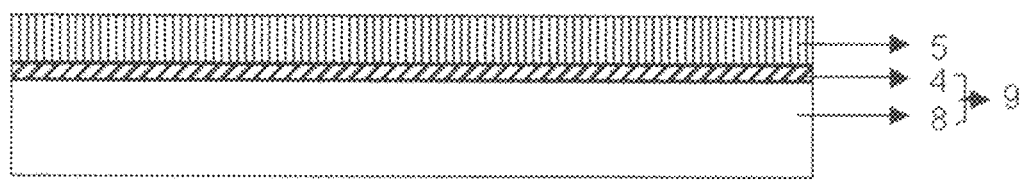
FIG. 1B is a schematic view of a structure of an ordered substrate.

One aspect of the present invention is to provide an organic semiconductor crystalline film. As shown by FIG. 1A, organic semiconductor molecules in organic semiconductor crystalline film 5 of the present invention are arranged in a stand-up manner on ordered substrate 9, and have oriented relationship with the ordered substrate 9, i.e., the crystalline direction with larger inter-molecular π-π interaction is orderly oriented in the film plane. As shown by FIG. 1b, the components of the ordered substrate 9 comprises: substrate 8 and ordered molecular layer 4; and the organic semiconductor crystalline film 5 is contacted with the ordered molecular layer 4 of the ordered substrate 9.

The materials used for the organic semiconductor crystalline film 5 can be either n-type semiconductor or p-type semiconductor. The semiconductor employed in the present invention is a p-type semiconductor material, and the details can be seen in the following introduction of steps and conditions 2 which are used for the preparation method of organic semiconductor polycrystalline films of the present invention, and the preparation of a weak oriented epitaxially grown organic crystalline film.

The organic semiconductor crystalline film 5 can be either continuous or discontinuous, which is prepared on the ordered substrate 9 by molecular vapor phase deposition method.

Another aspect of the present invention is to provide a preparation method of an organic semiconductor polycrystalline film by using "weak oriented epitaxy growth (WOEG)" process on an ordered substrate. In this method, organic semiconductor molecules are transported onto an ordered substrate mainly by a vapor phase deposition method or a solution process method, and the interaction between epitaxial molecule and the substrate is controlled under a certain growth temperature such that it is weaker than the interaction between epitaxial molecules, so that the epitaxial molecule may be epitaxially grown in a stand-up manner on the ordered substrate, thereby the crystalline direction with a larger inter-molecular π-π interaction is orderly oriented in the film plane.

The preparation method of organic semiconductor crystalline films of the present invention, which comprises preparing an ordered substrate 9 and growing an organic semiconductor crystalline film 5 thereon, is characterized in that the interaction between epitaxial molecule of the organic semiconductor crystalline film 5 and the substrate 9 is controlled such that it is weaker than the interaction between epitaxial molecules by controlling the growth temperature, so that the epitaxial molecule of the organic semiconductor crystalline film 5 are epitaxially grown in a stand-up manner on the ordered substrate 9, thereby the crystalline direction with a larger inter-molecular π-π interaction is orderly oriented in the film plane.

The detailed steps and conditions of the preparation method of organic semiconductor crystalline films are as follows:

1. Preparation of an ordered substrate:

An organic semiconductor ordered molecular layer 4 is deposited on a substrate 8 by using molecular vapor phase deposition method, thereby constituting an ordered substrate 9, under a vacuum degree of $10^{-4}$ Pa, at a temperature of the substrate of 35 to 200° C.

The organic semiconductor ordered molecular layer 4, as a part of the ordered substrate 9, may be an ordered multi-molecular layer or a mono-molecular layer, which employs p-type semiconductor materials selected from the group consisting of 5,5'-di(4-biphenyl)-2,2'-dithiophene (BP2T), 5,5'''-di(2-naphthyl)-2,2':5',2'':5'',2'''-tetrathiophene (NaT4), pentacene, hexathiophenyl (6T), para-hexaphenyl (6P) or triphenanthrene (Ph3).

2. Preparation of a weak oriented epitaxially grown organic crystalline film:

An organic semiconductor crystalline film 5 having a thickness of 10 nm to 50 nm is deposited on the organic semiconductor ordered molecular layer 4 of the ordered substrate 9 by using molecular vapor phase deposition method, at a temperature of the substrate of 30 to 200° C.;

The crystalline film 5 employs one or more materials selected from a p-type semiconductor material such as copper phthalocyanine (CuPc), zinc phthalocyanine (ZnPc), nickel phthalocyanine (NiPc), cobalt phthalocyanine (CoPc), free phthalocyanine (H2Pc), platinum phthalocyanine (PtPc), lead phthalocyanine (PbPc), Pentacene, 6P, BP2T, 5,5'-di(2-naphthyl)-2,2'-dithiophene (NaT2), 5,5''-di(2-naphthyl)-2,2':5',2''-trithiophene (NaT3), NaT4, 5,5''''-di(2-naphthyl)-2,2':5',2'':5'',2''':5''',2''''-pentathiophene (NaT5), 5,5'''''-di(2-naphthyl)-2,2':5',2'':5'',2''':5''',2'''':5'''',2'''''-hexathiophene (NaT6), 2,5-di(2-naphthyl)-[3,2-b]bidithiophene (NaTT), 5,5'-di(2-naphthyl)-2,2'-di[3,2-b]bidithiophene (NaTT2), 5,5'-di(2-thianaphthenyl)-2,2'-dithiophene (TNT2), 5,5"-di(2-thianaphthenyl)-2,2':5',2"-trithiophene (TNT3), 5,5'''-di(2-thianaphthenyl)-2,2':5',2":5",2'''-tetrathiophene (TNT4), 5,5''''-di(2-thianaphthenyl)-2,2':5',2":5",2''':5''',2''''-pentathiophene (TNT5), 2,5-di(2-thianaphthenyl)-[3,2-b]bidithiophene (TNTT), 5,5'-di(2-thianaphthenyl)-2,2'-di[3,2-b]bidithiophene (TNTT2), 5,5'-di(2-phenanthryl)-2,2'-dithiophene (PhT2), 5,5"-di(2-phenanthryl)-2,2':5',2"-trithiophene (PhT3), 5,5'''-di(2-phenanthryl)-2,2':5',2":5",2'''-tetrathiophene (PhT4), 2,5-di(2-phenanthryl)-[3,2-b]bidithiophene (PhTT), and 5,5'-di(2-phenanthryl)-2,2'-di[3,2-b]bidithiophene (PhTT2); and n-type semiconductor material such as copper fluorophthalocyanine ($F_{16}CuPc$), zinc fluorophthalocyanine ($F_{16}ZnPc$), iron fluorophthalocyanine ($F_{16}FePc$), cobalt fluorophthalocyanine ($F_{16}CoPc$) or fluoro-hexathiophene (DFH-6T).

The third aspect of the present invention is to provide organic transistor devices using organic semiconductor crystalline films as working substances. These organic transistors facilitate the integrated processes of glass substrates and plastic substrates, and can meet the requirements of organic integrated circuits, active matrix liquid crystal displays, active matrix electronic ink displays and active matrix organic luminescence displays.

The fourth aspect of the present invention is to provide organic phototransistor devices using organic semiconductor crystalline films as working substances. These organic phototransistors have significantly increased photo response characteristics, and obviously increased photo sensitivities.

The steps and conditions for preparing organic transistor devices and organic phototransistors by the weak oriented epitaxy growth preparation method using organic semiconductor crystalline films provided by the present invention are as follows:

1. Preparation of an ordered substrate:

A metal film of Ta, Al, Cr, or Mo is plated on a glass substrate or a plastic substrate 1 by using radio-frequency magnetron sputtering method, under the following conditions of the sputtering: a background vacuum degree of $2 \times 10^{-3}$ Pa, a pressure of Ar gas of 1 Pa, and a radio-frequency power of 500 W, and is formed into gate 2 by photolithography; a layer of $Ta_2O_5$, $Al_2O_3$, $TiO_2$, or $SiO_2$ having a thickness of 150-300 nm as insulation layer 3 is formed on the gate 2 by sputtering continuously using radio-frequency magnetron sputtering method; and then, an organic semiconductor ordered mono-molecular layer 4 is deposited on the insulation layer 3 using molecular vapor phase deposition method, thus constituting an ordered substrate, under a vacuum degree of $10^{-4}$ Pa, at the temperature of the substrate of 150° C.

The organic semiconductor ordered molecular layer as a part of the ordered substrate may be an ordered mono-molecular layer which is prepared generally by molecular vapor phase deposition method, and the materials employed may be either n-type semiconductor or p-type semiconductor. The semiconductor used in the examples of the present invention is a p-type semiconductor selecting from the group consisting of 5,5'-di(4-biphenyl)-2,2'-dithiophene (BP2T), 5,5'''-di(2-naphthyl)-2,2':5',2":5",2'''-tetrathiophene (NaT4), pentacene, hexathiophenyl (6T), para-hexaphenyl (6P) or triphenanthrene (Ph3).

2. Preparation of a weak oriented epitaxially grown organic crystalline film:

An organic semiconductor crystalline film 5 having a thickness of 10 nm to 50 nm is deposited on an ordered substrate by using molecular vapor phase deposition method, at a temperature of the substrate within 30-200° C.

The organic semiconductor crystalline films as working substances of transistors are generally prepared by using a molecular vapor phase deposition method or a solution method. They may be either n-type semiconductors or p-type semiconductors. The semiconductors used in the present invention each is a p-type semiconductor such as copper phthalocyanine (CuPc), zinc phthalocyanine (ZnPc), nickel phthalocyanine (NiPc), cobalt phthalocyanine (CoPc), free phthalocyanine (H2Pc), platinum phthalocyanine (PtPc), lead phthalocyanine (PbPc), Pentacene, 6P, BP2T, 5,5'-di(2-naphthyl)-2,2'-dithiophene (NaT2), 5,5"-di(2-naphthyl)-2,2':5',2"-trithiophene (NaT3), NaT4, 5,5''''-di(2-naphthyl)-2,2':5',2":5",2''':5''',2''''-pentathiophene (NaT5), 5,5'''''-di(2-naphthyl)-2,2':5',2":5",2''':5''',2'''':5'''',2'''''-hexathiophene (NaT6), 2,5-di(2-naphthyl)-[3,2-b]bidithiophene (NaTT), 5,5'-di(2-naphthyl)-2,2'-di[3,2-b]bidithiophene (NaTT2), 5,5'-di(2-thianaphthenyl)-2,2'-dithiophene (TNT2), 5,5"-di(2-thianaphthenyl)-2,2':5',2"-trithiophene (TNT3), 5,5'''-di(2-thianaphthenyl)-2,2':5',2":5",2'''-tetrathiophene (TNT4), 5,5''''-di(2-thianaphthenyl)-2,2':5',2":5",2''':5''',2''''-pentathiophene (TNT5), 2,5-di(2-thianaphthenyl)-[3,2-b]bidithiophene (TNTT), 5,5'-di(2-thianaphthenyl)-2,2'-di[3,2-b]bidithiophene (TNTT2), 5,5'-di(2-phenanthryl)-2,2'-dithiophene (PhT2), 5,5"-di(2-phenanthryl)-2,2':5',2"-trithiophene (PhT3), 5,5'''-di(2-phenanthryl)-2,2':5',2":5",2'''-tetrathiophene (PhT4), 2,5-di(2-phenanthryl)-[3,2-b]bidithiophene (PhTT), and 5,5'-di(2-phenanthryl)-2,2'-di[3,2-b]bidithiophene (PhTT2); or a n-type semiconductor such as copper fluorophthalocyanine ($F_{16}CuPC$), zinc fluorophthalocyanine ($F_{16}ZnPc$), iron fluorophthalocyanine ($F_{16}FePc$), cobalt fluorophthalocyanine ($F_{16}CoPc$) or fluoro-hexathiophene (DFH-6T).

3. A layer of Au having a thickness of 60 nm is composted on the semiconductor crystalline film 5 by using vacuum thermal deposition method. The vacuum degree under which the thermal deposition is performed is $10^{-4}$ Pa.

Figure 3A:
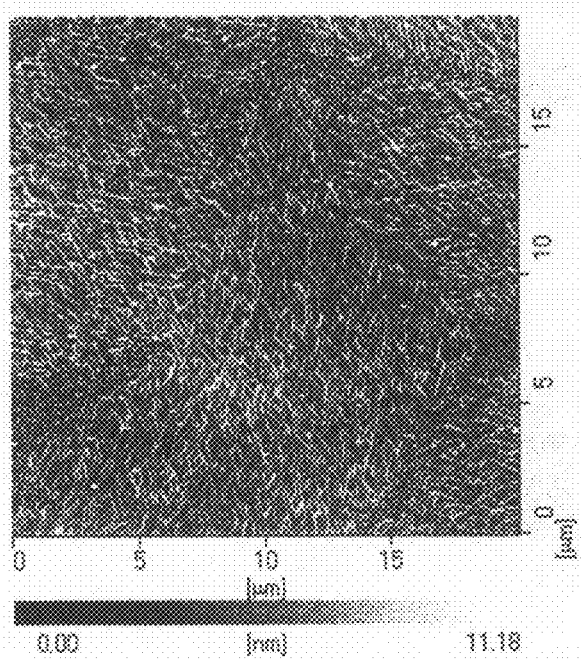
FIG. 3A is an atomic force microscope image of a profile of a $F_{16}CuPc$ crystalline film having a thickness of 5 nm deposited on the organic semiconductor crystalline film in FIG. 1A at a deposition temperature of 180° C. using vapor phase deposition method.
Figure 3B:
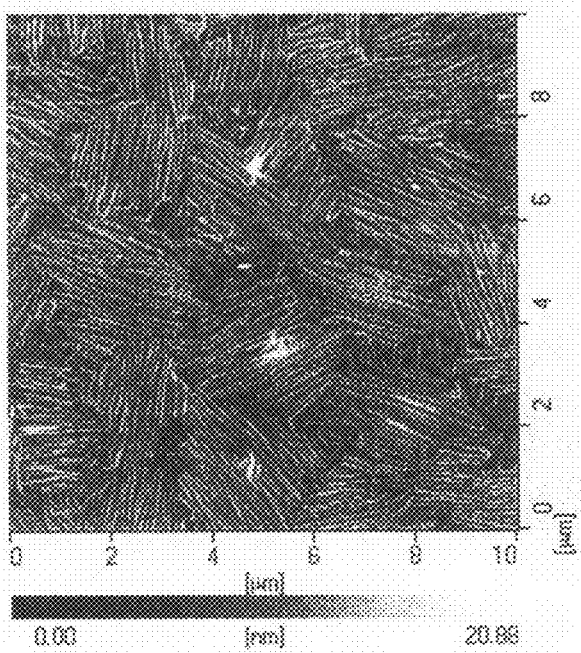
FIG. 3B is an atomic force microscope image of a profile of a $F_{16}CuPc$ crystalline film having a thickness of 20 nm deposited on the 6P ordered mono-molecular layer in FIG. 2A at a deposition temperature of 180° C. using vapor phase deposition method.

The organic transistor devices and the organic phototransistor devices in which organic semiconductor crystalline films are prepared by weak oriented epitaxy growth method are suitable for use in bottom-contact device and top-contact device structures which are shown in FIGS. 3A and 3B, and other device structures.

The advantages of the preparation method of the present invention are as follows: the high carrier mobility direction of organic semiconductor crystals with ordered orientation in the film can be controlled, the contacts between crystals can be enhanced, and the mechanical strength and micro-machining property of the film can be improved, and a high carrier mobility of 0.01 $cm^2/Vs$ or more is obtained. For example, taking the carrier mobility property of copper phthalocyanine crystal as an example, the carrier mobility is 0.3-1.0 $cm^2/Vs$ for single crystal thereof (Appl. Phys. Lett., 2005, 86, 022103; Adv. Mater., 2006, 18, 719-723), 0.04 $cm^2/Vs$ for vapor phase deposited film thereof (Appl. Phys. Lett., 2004, 84, 142-144), and 0.0018 $cm^2/Vs$ for strong oriented epitaxially grown film thereof (Chem. Mater., 2001, 13, 1341-1348). The carrier mobility of the weak oriented epitaxially grown film of the present invention is 0.24 $cm^2/Vs$, which is 5 times as large as that of vapor phase deposited film, and is similar to that of single crystal. Another advantage of the preparation method of the present invention is that it is suitable for glass substrates and plastic substrates.

The principle of the present invention is to control the interaction between epitaxial molecule and substrate to be weaker than the interaction between epitaxial molecules, under a certain growth temperature, so that the epitaxial molecule may be epitaxially grown in a stand-up manner on the ordered substrate, thereby the crystalline direction with a larger inter-molecular π-π interaction is orderly oriented in the film plane. The two organic semiconductor layers have an epitaxial relationship, thereby forming a more ordered film structure and reducing defect density in the organic semiconductor film, so that the carrier mobility of the organic semiconductor can be enhanced significantly.

The film of the ordered substrate may be an organic semiconductor mono-molecular layer. A heterojunction effect can exist between the organic semiconductor in the mono-molecular layer and the weak epitaxial organic semiconductor, thus discontinuous domains with high electric conductivity can be formed therebetween, which can reduce significantly the close state current and improve simultaneously the electric transport property of the organic semiconductor, thereby stabilizing significantly the working voltage of the device.

Since interactions exist between the organic semiconductor in the mono-molecular layer and the weak epitaxial organic semiconductor, giving a heterojunction effect therebetween, thus showing a different photo-response characteristic. The phototransistors prepared with the organic heterojunctions have higher photo sensitivities.

FIG. 1A is a schematic view of a structure of an organic semiconductor crystalline film, wherein reference number 5 represents an organic semiconductor crystalline film and reference number 9 represents an ordered substrate.

FIG. 1B is a schematic view of a structure of an ordered substrate 9, wherein ordered substrate 9 comprises: substrate 8 and ordered molecular layer 4; and the organic semiconductor crystalline film 5 contacted with the ordered molecular layer 4 of ordered substrate 9.

Figure 2A:
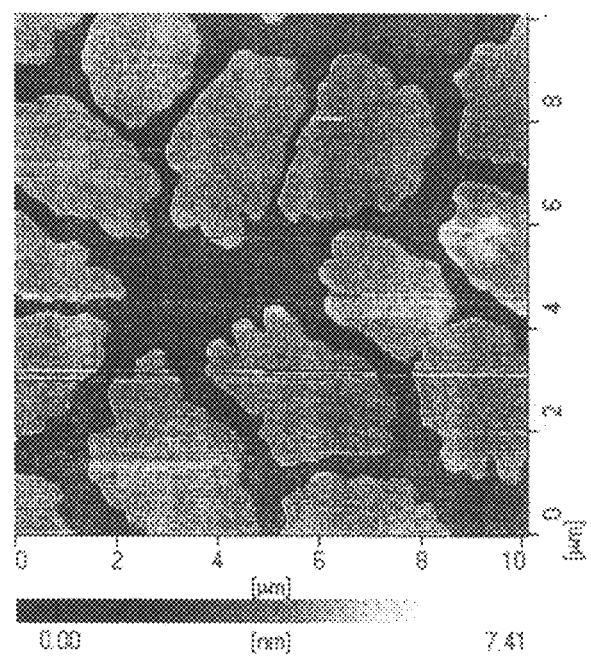
FIG. 2A is an atomic force microscope image of a profile of a 6P ordered mono-molecular layer deposited on a surface of $SiO_2$ substrate at a deposition temperature of 180° C. using vapor phase deposition method.

FIG. 2A is an atomic force microscope image of a profile of a 6P ordered mono-molecular layer deposited on a surface of $SiO_2$ substrate at a deposition temperature of 180° C. using vapor phase deposition method. The 6P single domains are irregular polygonal forms having diameters about 3 micrometers.

Figures 2B, 2C:
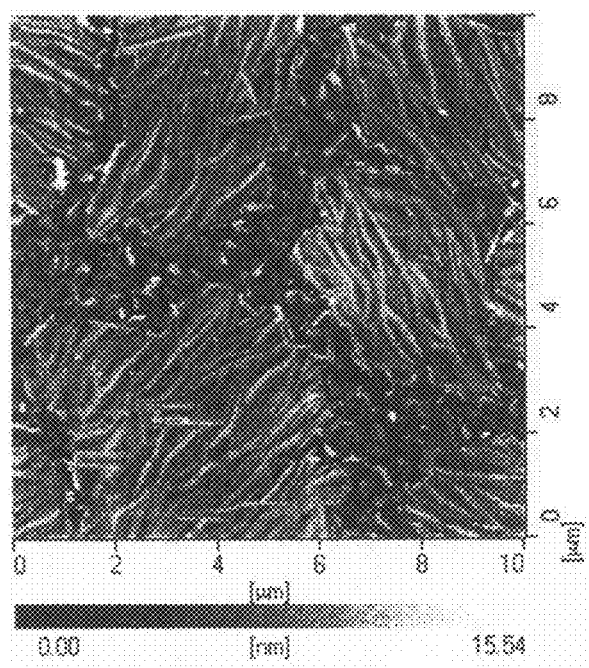
FIG. 2B is an atomic force microscope image of a profile of a ZnPc crystalline film having a thickness of 5 nm deposited on the 6P ordered mono-molecular layer of FIG. 2A at a deposition temperature of 180° C. using vapor phase deposition method.
FIG. 2C is a selected area electron diffraction spectrum of the abovementioned double-layers film of 6P and ZnPc which has been transferred onto a copper meshwork for transmission electron microscope.

FIG. 2B is an atomic force microscope image of a profile of a ZnPc crystalline film having a thickness of 5 nm deposited on the 6P ordered mono-molecular layer of FIG. 2A at a deposition temperature of 180° C. using vapor phase deposition method. The strip-like ZnPc crystals grown on 6P individual domain surface have two oriented arrangements, and the ZnPc crystals oriented arranged areas are irregular polygonal forms having diameters of about 4 micrometers. However, ZnPc crystals are oriented randomly in the areas not covered by 6P.

FIG. 2C is a selected area electron diffraction spectrum of abovementioned double-layers film of 6P and ZnPc which has been transferred onto a copper meshwork for transmission electron microscope. The 6P single domains exhibit (001)* two-dimensional single crystal electron diffraction of γ-phase, and α-phase ZnPc strip-like crystals exhibit (002) diffraction of a polycrystalline diffraction oriented relative to 6P crystal (001)*.

Figure 2D:
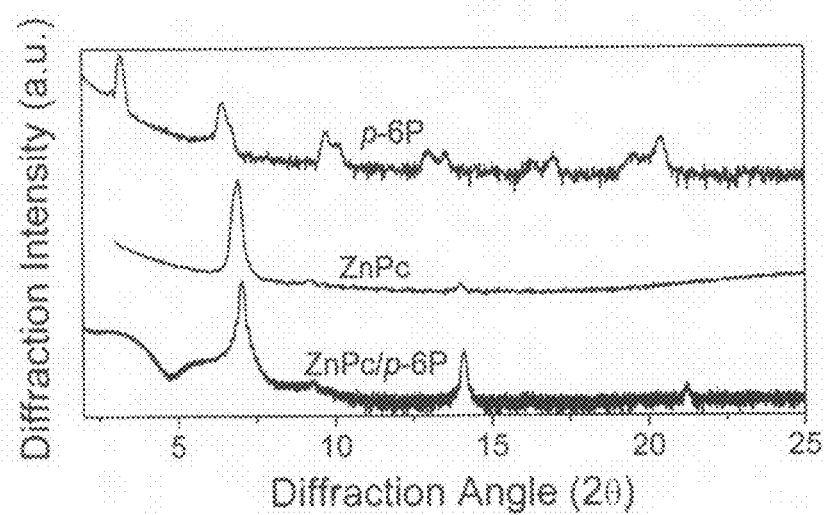
FIG. 2D is a reflective x-ray diffraction spectrum of a ZnPc crystalline film having a thickness of 20 nm deposited on the 6P ordered mono-molecular layer in FIG. 2A at a deposition temperature of 180° C. using vapor phase deposition method.

FIG. 2D is a reflective x-ray diffraction spectrum of a ZnPc crystalline film having a thickness of 20 nm deposited on the 6P ordered mono-molecular layer in FIG. 2A at a deposition temperature of 180° C. using vapor phase deposition method. The (200) diffraction of α-phase ZnPc indicates that ZnPc molecules are oriented grown on the γ-phase (001) crystal plane of 6P in a stand-up manner.

Figure 2E:
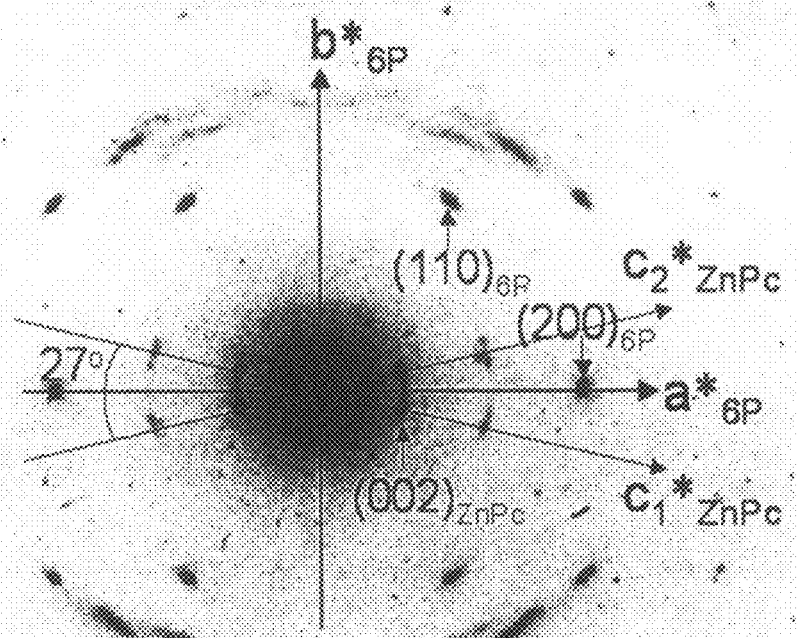
FIG. 2E further shows the oriented relationship between the 6P two-dimensional single crystals and the ZnPc polycrystals in FIG. 2C.

FIG. 2E further shows the oriented relationship between 6P two-dimensional single crystals and ZnPc polycrystals in FIG. 2C. There is a oriented relationship of about 13.5° existing between c axis of α-phase ZnPc strip-like crystal and a axis of γ-phase 6P crystal.

Figure 2F:
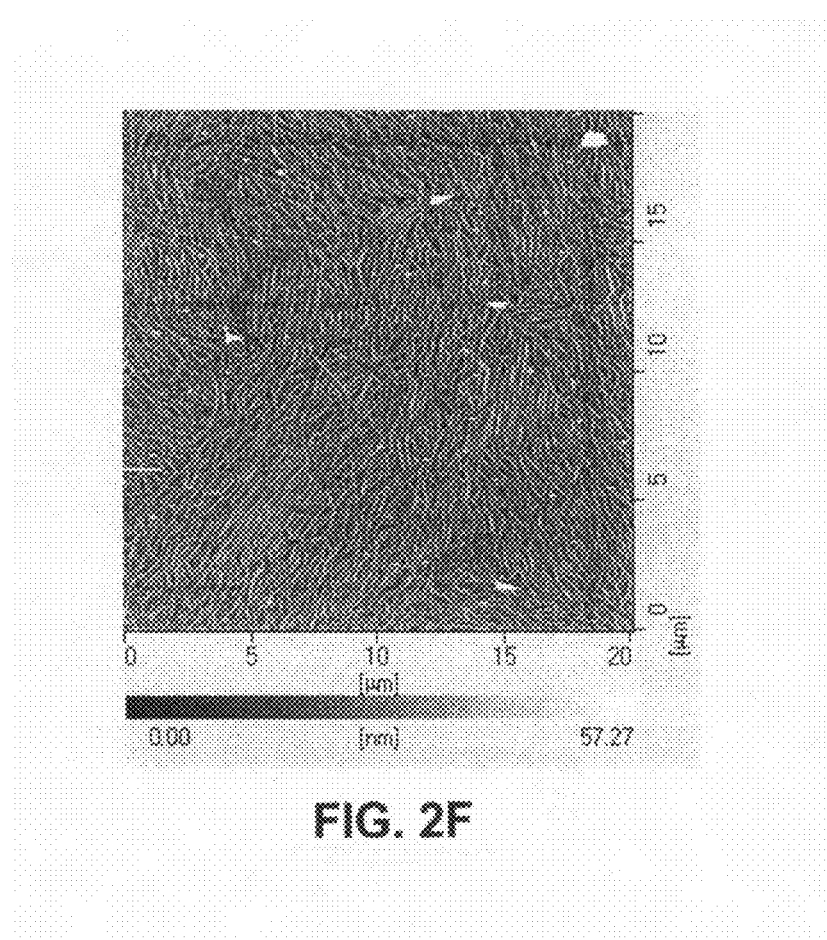
FIG. 2F is an atomic force microscope image of a profile of a ZnPc crystalline film having a thickness of 20 nm deposited on the γ-phase (001) crystal plane of 6P in FIG. 2A at a deposition temperature of 180° C. using vapor phase deposition method.

FIG. 2F is an atomic force microscope image of a profile of a ZnPc crystalline film having a thickness of 20 nm deposited on the γ-phase (001)crystal plane of 6P in FIG. 2A at a deposition temperature of 180° C. using vapor phase deposition method. The oriented domains of strip-like ZnPc crystals grown on the surface of 6P single domains are connected with adjacent oriented domains. The crystalline film has a surface roughness of about 2.3 nm, while the surface roughness of ZnPc crystalline film grown on a non-crystal $SiO_2$ surface under the same preparing conditions is about 10.2 nm.

FIG. 3A is an atomic force microscope image of a profile of a $F_{16}CuPc$ crystalline film having a thickness of 5 nm deposited on the organic semiconductor crystalline film in FIG. 1A at a deposition temperature of 180° C. using vapor phase deposition method. The strip-like $F_{16}CuPc$ crystals grown on 6P individual domain surface have two oriented arrangements, and the $F_{16}CuPc$ crystals oriented arranged areas are irregular polygonal forms having diameters of about 10 micrometers. However, $F_{16}CuPc$ crystals are oriented randomly in the areas not covered by 6P.

FIG. 3B is an atomic force microscope image of a profile of a $F_{16}CuPc$ crystalline film having a thickness of 20 nm deposited on the 6P ordered mono-molecular layer in FIG. 2A at a deposition temperature of 180° C. using vapor phase deposition method. The oriented domains of strip-like $F_{16}CuPc$ crystals grown on the surface of 6P single domains are connected with adjacent oriented domains. The crystalline film has a surface roughness of about 2.6 nm, and the surface roughness of $F_{16}CuPc$ crystalline film grown on a non-crystal $SiO_2$ surface under the same preparing conditions is about 9.7 nm.

Figure 4A:
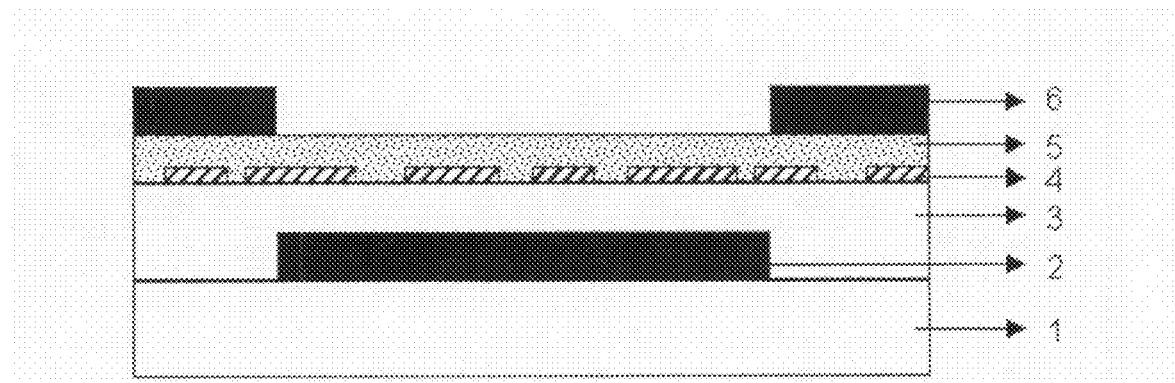
FIG. 4A is a schematic view showing the first structure of an organic transistor having an organic semiconductor crystalline film weak oriented epitaxially grown on an ordered mono-molecular layer.

FIG. 4A is a schematic view showing the first structure of an organic transistor having an organic semiconductor crystalline film weak oriented epitaxially grown on an ordered mono-molecular layer. Gate electrode 2 having a pattern is formed on substrate 1, insulator layer 3 is formed on gate electrode 2 having a pattern and substrate 1, and ordered mono-molecular layer 4 is formed on insulator layer 3, thus constituting an ordered substrate. Hole-type and/or electron-type organic semiconductor crystalline film 5 is weak oriented epitaxially grown on the ordered substrate, and source and drain electrodes 6 having patterns are formed on the organic semiconductor crystalline film 5.

Figure 4B:
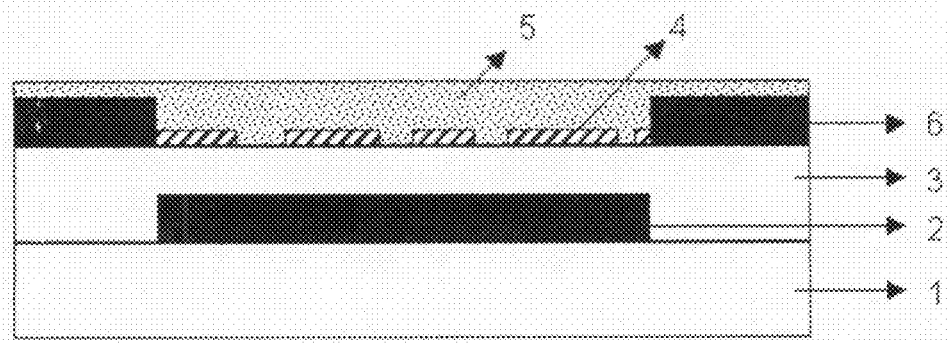
FIG. 4B is a schematic view showing the second structure of an organic transistor having an organic semiconductor crystalline film weak oriented epitaxially grown on an ordered mono-molecular layer.

FIG. 4B is a schematic view showing the second structure of an organic transistor having an organic semiconductor crystalline film weak oriented epitaxially grown on an ordered mono-molecular layer. Gate electrode 2 having a pattern is formed on substrate 1, insulator layer 3 is formed on gate electrode 2 having a pattern and substrate 1, source and drain electrodes 6 are formed on insulator layer 3, and ordered mono-molecular layer 4 is formed on insulator layer 3 and source and drain electrodes 6, thus constituting an ordered substrate. Hole-type and/or electron-type organic semiconductor crystalline film 5 is weak oriented epitaxially grown on the ordered substrate.

Figure 5:
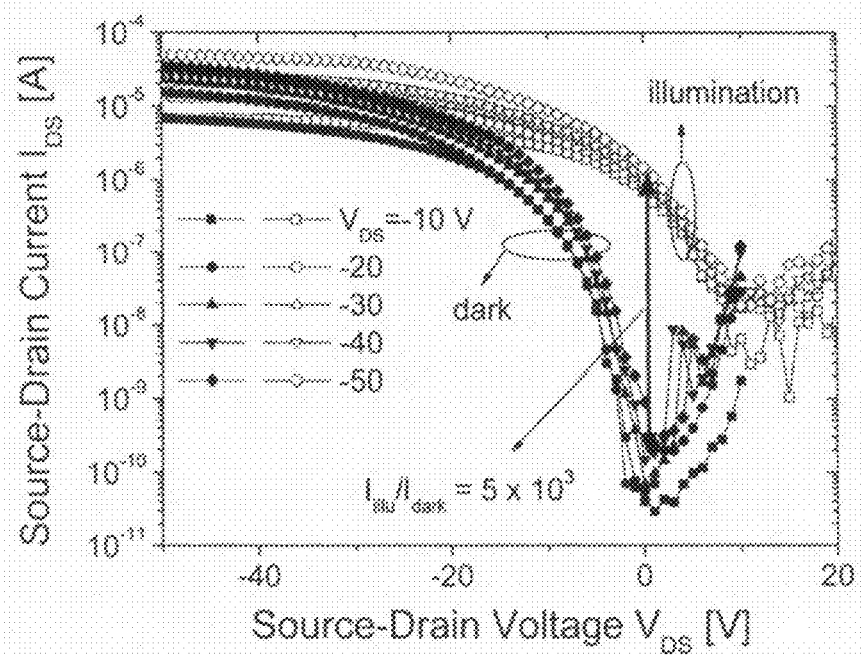
FIG. 5 shows the transfer characteristic curves of an organic transistor prepared with zinc phthalocyanine crystalline film weak oriented epitaxially grown on an organic semiconductor para-hexaphenyl (6P) ordered mono-molecular layer.

FIG. 5 shows the transfer characteristic curves of an organic transistor prepared with zinc phthalocyanine crystalline film weak oriented epitaxially grown on an organic semiconductor para-hexaphenyl (6P) ordered mono-molecular layer. The field effect hole mobility is 0.32 cm$^2$/V s, which is ten times higher than non-oriented zinc phthalocyanine film, the threshold voltage is −3.2 V, and the on/off current ratio is $10^5$. Simultaneously, FIG. 5 also shows the transfer characteristic curves under light illumination, wherein the current after light illumination increases 5000 times than that of transfer curve in a dark state, and photo sensitivity reaches to 1.15 A/W, indicating that the devices are also a kind of organic photo-sensitive transistors with high sensitivities and high dynamics performances.

Figure 6A:
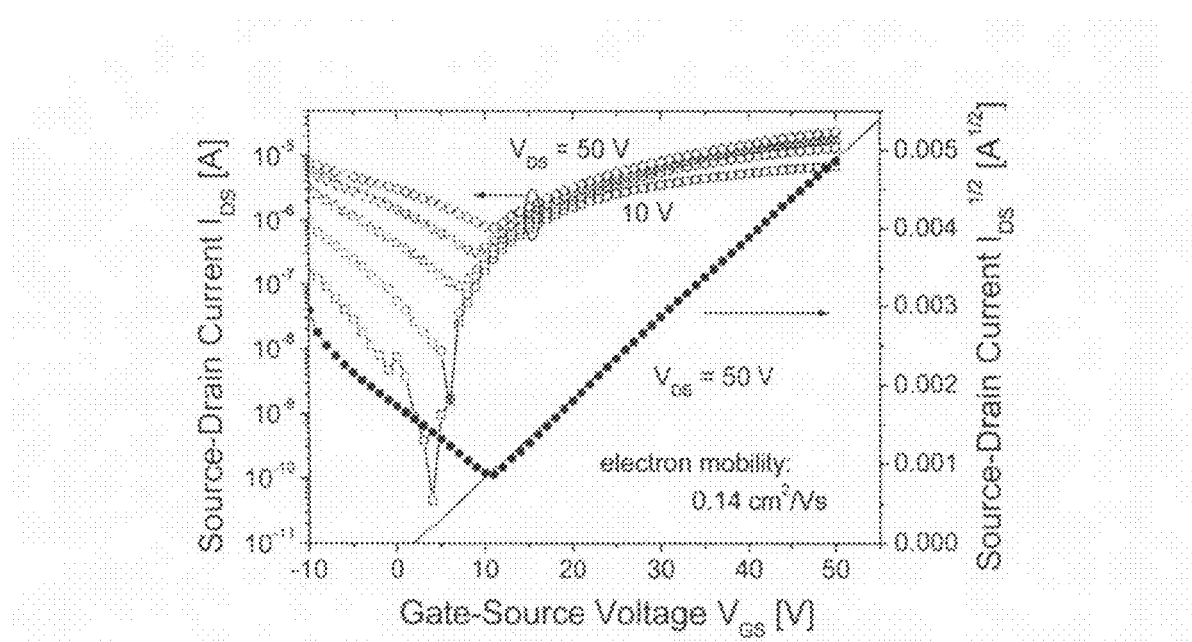
FIG. 6A shows the transfer characteristic curves of an organic transistor prepared with copper fluoro-phthalocyanine crystalline film weak oriented epitaxially grown on an organic semiconductor para-hexaphenyl (6P) ordered mono-molecular layer.

FIG. 6A shows the transfer characteristic curves of an organic transistor prepared with copper fluoro-phthalocyanine crystalline film weak oriented epitaxially grown on an organic semiconductor para-hexaphenyl (6P) ordered mono-molecular layer. The field effect electron mobility is 0.14 $cm^2/V$ s, the threshold voltage is 1.87 V, and the on/off current ratio is about $10^3$. As gate voltage increases, the on/off current ratio decreases.

Figure 6B:
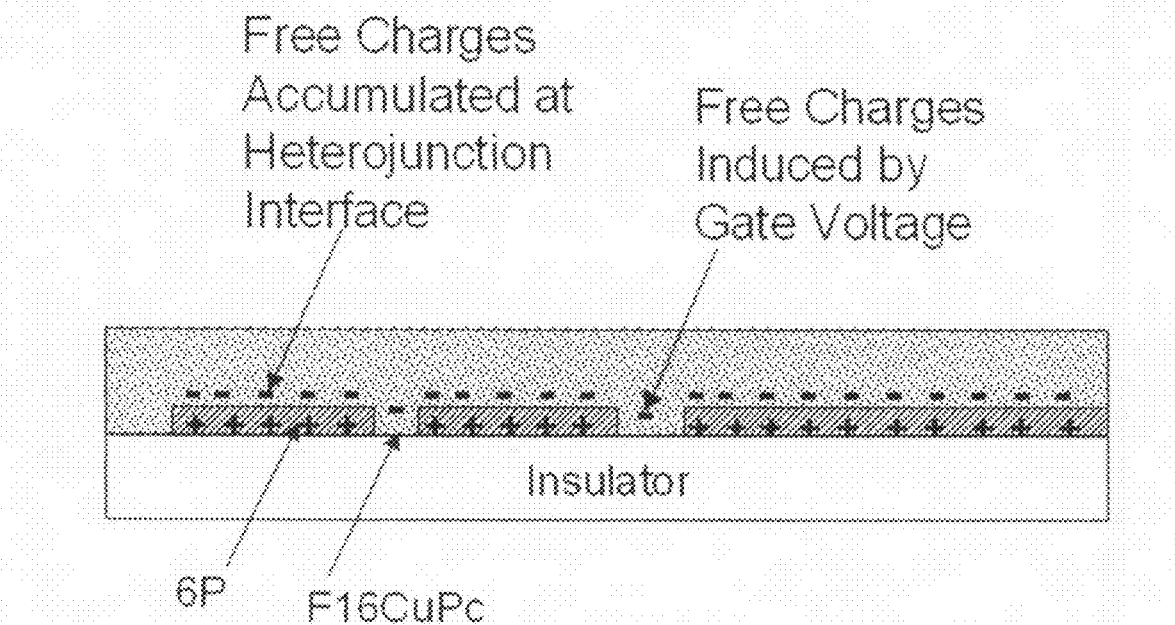
FIG. 6B further explains a heterojunction effect existing between p-type 6P mono-molecular layer and n-type $F_{16}CuPc$ crystalline film in FIG. 6A.

FIG. 6B further explains a heterojunction effect existing between p-type 6P mono-molecular layer and n-type $F_{16}CuPc$ crystalline film in FIG. 6A. This heterojunction effect imparts the contact interface between 6P and $F_{16}CuPc$ high electron conductivity. Thus, the formation of conductive channel controlled by actual device gate voltage is depended on the electron accumulating state in the areas of p-type $F_{16}CuPc$ crystalline film that do not contact with 6P mono-molecular layer. The device exhibits a short channel effect of $F_{16}CuPc$, which not only improves the macroscopic electron mobility of the device, but also reduces the threshold voltage of the device. A discontinuous 6P mono-layer film gives the device a high on/off current ratio under a low gate voltage.

EXAMPLES

The present invention is described further by the following examples.

Example 1

Target materials of $Ta_2O_5$, $Al_2O_3$, $TiO_2$, and $SiO_2$ used in the present invention were all commercial products, which were employed directly. Glass substrates and plastic substrates were commercial products, and were employed after washing. 6P, ZnPc, and $F_{16}CuPc$ used herein were commercial products which were employed after being purified by sublimation method.

A layer of $Ta_2O_5$, $Al_2O_3$, $TiO_2$, or $SiO_2$ film having a thickness of 150-500 nm was formed on a glass substrate or plastic substrate 1 by sputtering continuously using radio-frequency magnetron sputtering method. Thereafter, an organic semiconductor 6P ordered molecular layer 4 having a thickness of 5-20 nm was deposited on the $Ta_2O_5$, $Al_2O_3$, $TiO_2$, or $SiO_2$ film at a growth temperature of 30-180° C. using molecular vapor phase deposition method, thus an ordered substrate was constituted, under a vacuum degree of $10^{-4}$ Pa. Thereafter, an organic semiconductor ZnPc or $F_{16}CuPc$ crystalline film 5 having a thickness of 5-20 nm was deposited continuously at a growth temperature within 30-200° C. on the ordered substrate.

FIG. 1A is a schematic view showing the structural position relationship of the ordered substrate and the organic semiconductor crystalline film. FIG. 1B is a schematic view of the structure of the ordered substrate, wherein the ordered substrate 9 comprises: substrate 8 and ordered molecular layer 4; and organic semiconductor crystalline film 5 which may be continuous or discontinuous.

FIG. 2A is an atomic force microscope image of a profile of a discontinuous 6P ordered mono-molecular layer having a thickness of 5 nm deposited on an insulator layer; FIG. 2B is an atomic force microscope image showing the profile of an surface of organic semiconductor ZnPc crystalline film having a thickness of 5 nm deposited on the discontinuous 6P ordered mono-molecular layer; FIG. 2C is a selected area electron diffraction spectrum of FIG. 2B; FIG. 2D is a reflective x-ray diffraction spectrum of a continuous organic semiconductor layer ZnPc crystalline film having a thickness of about 20 nm deposited on the discontinuous 6P ordered mono-molecular layer; FIG. 2E further shows the oriented relationship between 6P mono-molecular layer ordered single domains and weakly oriented epitaxial ZnPc strip-like crystals in FIG. 2C; and FIG. 2F is an atomic force microscope image of a profile of a surface of organic semiconductor ZnPc crystalline film having a thickness of about 20 nm deposited on the discontinuous 6P ordered mono-molecular layer. As seen from FIG. 2E, the growth direction c of strips of ZnPc crystals oriented grown has an angle of about 13.5° with respect to an axis of 6P single domains. FIG. 3A is an atomic force profile image of a surface of organic semiconductor $F_{16}CuPc$ crystalline film having a thickness of about 5 nm deposited on the discontinuous 6P ordered mono-molecular layer, and FIG. 3B is an atomic force profile image of a surface of organic semiconductor $F_{16}CuPc$ crystalline film having a thickness of about 20 nm deposited on the discontinuous 6P ordered mono-molecular layer, showing similar properties as that of ZnPc crystal growth. All the abovementioned organic semiconductors exhibited a behavior of weak oriented epitaxy growth.

The oriented ZnPc film exhibited excellent electric performance and photo response characteristic, with a field effect mobility ten times bigger than that of un-oriented ZnPc film, reaching 0.32 $cm^2/V$ s, threshold voltage was −3.2 V, and on/off current ratio was $10^5$.

Example 2

A layer of $Ta_2O_5$, $Al_2O_3$, $TiO_2$, or $SiO_2$ film having a thickness of 150-500 nm was formed on a glass substrate or plastic substrate 1 by sputtering continuously using radio-frequency magnetron sputtering method. Thereafter, an organic semiconductor 6P ordered molecular layer 4 having a thickness of 5-20 nm was deposited on the $Ta_2O_5$, $Al_2O_3$, $TiO_2$, or $SiO_2$ film at a growth temperature of 30-180° C. using molecular vapor phase deposition method, thus an ordered substrate was constituted, under a vacuum degree of $10^{-4}$ Pa. Thereafter, an organic semiconductor ZnPc or $F_{16}CuPc$ crystalline film 5 having a thickness of 5-50 nm was deposited continuously at a growth temperature within 30-200° C. on the ordered substrate. The other conditions and results were the same as those of Example 1.

Example 3

A layer of $Ta_2O_5$, $Al_2O_3$, $TiO_2$, or $SiO_2$ film having a thickness of 250 nm was formed on a glass substrate or plastic substrate 1 by sputtering continuously using radio-frequency magnetron sputtering method. Thereafter, an organic semiconductor 6P ordered molecular layer 4 having a thickness of 10 nm was deposited on the $Ta_2O_5$, $Al_2O_3$, $TiO_2$, or $SiO_2$ film at a growth temperature of 90° C. using molecular vapor phase deposition method, thus an ordered substrate was constituted, under a vacuum degree of $10^{-4}$ Pa. Thereafter, an organic semiconductor ZnPc or $F_{16}CuPc$ crystalline film 5 having a thickness of 20 nm was deposited continuously at a growth temperature of 50° C. on the ordered substrate. The other conditions and results were same as those of Example 1.

Example 4

A layer of $Ta_2O_5$, $Al_2O_3$, $TiO_2$, or $SiO_2$ film having a thickness of 350 nm was formed on a glass substrate or plastic substrate 1 by sputtering continuously using radio-frequency magnetron sputtering method. Thereafter, an organic semiconductor 6P ordered molecular layer 4 having a thickness of 15 nm was deposited on the $Ta_2O_5$, $Al_2O_3$, $TiO_2$, or $SiO_2$ film at a growth temperature of 120° C. using molecular vapor phase deposition method, thus an ordered substrate was constituted, under a vacuum degree of $10^{-4}$ Pa. Thereafter, an organic semiconductor ZnPc or $F_{16}CuPc$ crystalline film 5 having a thickness of 30 nm was deposited continuously at a growth temperature of 100° C. on the ordered substrate. The other conditions and results were same as those of Example 1.

Example 5

A layer of $Ta_2O_5$, $Al_2O_3$, $TiO_2$, or $SiO_2$ film having a thickness of 500 nm was formed on a glass substrate or plastic substrate 1 by sputtering continuously using radio-frequency magnetron sputtering method. Thereafter, an organic semiconductor 6P ordered molecular layer 4 having a thickness of 20 nm was deposited on the $Ta_2O_5$, $Al_2O_3$, $TiO_2$, or $SiO_2$ film at a growth temperature of 180° C. using molecular vapor phase deposition method, thus an ordered substrate was constituted, under a vacuum degree of $10^{-4}$ Pa. Thereafter, an organic semiconductor ZnPc or $F_{16}CuPc$ crystalline film 5 having a thickness of 50 nm was deposited continuously at a growth temperature of 200° C. on the ordered substrate. The other conditions and results were same as those of Example 1.

Example 6

Target materials of $Ta_2O_5$, $Al_2O_3$, $TiO_2$, and $SiO_2$, and metal electrodes of Au, Al, Cr, and Mo used in the present invention were all commercial products, which were employed directly. Glass substrates and plastic substrates were commercial products, and were employed after washing. CuPc, ZnPc, NiPc, CoPc, $H_2Pc$, PtPc, PbPc, Pentacene, $F_{16}CuPc$, $F_{16}ZnPc$, $F_{16}FePc$ and $F_{16}CoPc$ used herein were commercial products which were employed after being purified by sublimation method. 4T, 5T, 6T, 6P, BP2T, NaT2, NaT3, NaT4, NaT5, NaT6, NaTT, NaTT2, TNT2, TNT3, TNT4, TNT5, TNTT, TNTT2, PhT2, PhT3, PhT4, PhTT, PhTT2 and fluoro-hexathiophene (DFH-6T) were synthesized materials (reference documents: Angew. Chem. Int. Ed. 2000, 39, 4547; Heterocycle, 1983, 20, 1937; Chem. Mater. 1995, 7, 2235; J. Am. Chem. Soc. 1984, 106, 4977; J. Heterocyclic Chem. 2000, 37, 281, and patents: CN200510016895.9, CN200510119001.9, and CN200510119064.4), which were employed after being purified by sublimation method.

The first device structure of organic transistors was shown in FIG. 4A. A metal film of Ta, Al, Cr, or Mo was plated on 7059 glass substrate or plastic substrate 1 using radio-frequency magnetron sputtering method, under the following sputtering conditions: background vacuum degree was $2\times10^{-3}$ Pa, pressure of Ar gas was 1 Pa, and radio-frequency power was 500 W, and was formed into gate 2 by photolithography. A layer of $Ta_2O_5$, $Al_2O_3$, $TiO_2$, or $SiO_2$ having a thickness of 300 nm as insulation layer 3 was formed on the gate 2 by sputtering continuously using radio-frequency magnetron sputtering method. Then, an organic semiconductor ordered molecular layer 4 was deposited on the insulation layer 3 using molecular vapor phase deposition method, thus constituting an ordered substrate, under a vacuum of $10^{-4}$ Pa. The ordered molecular layer 4 herein might be a multi-layer or a mono-layer, and might be continuous or discontinuous. The organic semiconductor might be either the abovementioned n-type semiconductor or the abovementioned p-type semiconductor. Thereafter, an organic semiconductor crystalline film 5 having a thickness of 4 nm to 40 nm was deposited continuously on the ordered substrate, the deposition method and conditions were same as above. Also, the organic semiconductor crystalline film 5 could be the abovementioned n-type semiconductor or abovementioned p-type semiconductor. Finally, a layer of Au having a thickness of 60 nm was deposited on the semiconductor crystalline film 5 using vacuum thermal deposition method. The vacuum degree under which the thermal deposition was performed was $10^{-4}$ Pa. The structure of the prepared transistor was shown in FIG. 3A.

The oriented ZnPc film exhibited excellent electric performance and photo response characteristic, with a field effect mobility ten times larger than that of un-oriented ZnPc film, which reached to 0.32 $cm^2/V$ s, threshold voltage was −3.2 V, and on/off current ratio was $10^5$. FIG. 5 showed the transfer characteristic curves of an organic transistor prepared with zinc phthalocyanine crystalline film weak oriented epitaxially grown on an organic semiconductor 6P ordered mono-molecular layer. Simultaneously, FIG. 5 shows also the transfer characteristic curves under light illumination, wherein the current after light illumination increased 5000 times than that of transfer curve in a dark state, and photo-sensitivity reached 1.15 A/W.

FIG. 6A shows the transfer characteristic curves of an organic transistor prepared with $F_{16}CuPc$ crystalline film weakly oriented epitaxially grown on an organic semiconductor 6P ordered mono-molecular layer. Due to the interaction between 6P and $F_{16}CuPc$ heterojunctions, carriers were accumulated around 6P single domains and part of $F_{16}CuPc$ contacted with them, wherein holes were accumulated in 6P and electrons were accumulated in $F_{16}CuPc$. Therefore, a high electron conductivity region was formed around 6P single domain, resulting in a relatively low on/off current ratio. FIG. 6B illustrates this case.

Performances of devices assembled by different semiconductors and their photo responses under light illumination are listed in Table 1.

TABLE 1

| Ordered mono-molecular layer 4 | Semiconductor crystalline film 5 | Mobility ($cm^2/V$ s) | Threshold voltage (V) | On/off current ratio | Photo-sensitivity (A/W) |
|---|---|---|---|---|---|
| 6P | $F_{16}CuPc$ | 0.12 | 6 | $10^4$ | 0.175 |
| 6P | $F_{16}CoPc$ | 0.10 | 3 | $10^4$ | 0.201 |
| 6P | $F_{16}ZnPc$ | 0.21 | 8 | $10^4$ | 0.186 |
| 6P | $F_{16}FePc$ | 0.15 | 7 | $10^4$ | 0.164 |
| 6P | DHF-6T | 0.18 | 10 | $10^4$ | 0.251 |
| 6P | CuPc | 0.16 | −16.7 | $10^5$ | 1.21 |
| 6P | ZnPc | 0.32 | −3.2 | $10^5$ | 1.15 |
| 6P | NiPc | 0.024 | −20.3 | $10^4$ | 1.5 |
| 6P | CoPc | 0.017 | −14.3 | $10^4$ | 1.34 |
| 6P | CuPc: CoPc | 0.18 | −8.2 | $10^4$ | 2.74 |
| 6P | PtPc | 0.21 | −5.4 | $10^4$ | 2.12 |
| 6P | PbPc | 0.18 | −3.2 | $10^4$ | 2.46 |

TABLE 1-continued

| Ordered mono-molecular layer 4 | Semiconductor crystalline film 5 | Mobility (cm²/V s) | Threshold voltage (V) | On/off current ratio | Photo-sensitivity (A/W) |
|---|---|---|---|---|---|
| 6P | H₂Pc | 0.03 | −21.5 | 10⁴ | 1.86 |
| 6P | Pentacene | 1.5 | −2.7 | 10⁵ | 1.41 |
| 6P | BP2T | 0.02 | −9 | 10⁵ | 0.36 |
| 6P | 4T | 0.14 | −2.1 | 10⁴ | 1.39 |
| 6P | 5T | 0.16 | −3.6 | 10⁴ | 1.48 |
| 6P | 6T | 0.29 | −5.1 | 10⁵ | 1.91 |
| 6P | NaT4 | 0.14 | −6.7 | 10⁵ | 1.01 |
| 6P | NaT2 | 0.11 | −5.7 | 10⁵ | 0.61 |
| 6P | NaT3 | 0.091 | −9.4 | 10⁴ | 0.43 |
| 6P | NaT5 | 0.086 | −10.4 | 10⁴ | 0.97 |
| 6P | NaT6 | 0.12 | −6.2 | 10⁵ | 1.43 |
| 6P | NaTT | 0.06 | −5.3 | 10⁴ | 0.98 |
| 6P | NaTT2 | 0.18 | −4.3 | 10⁴ | 0.84 |
| 6P | TNT5 | 0.12 | −8.1 | 10⁴ | 0.51 |
| 6P | TNT4 | 0.24 | −6.4 | 10⁴ | 0.21 |
| 6P | TNT3 | 0.20 | −9.1 | 10⁵ | 0.67 |
| 6P | TNT2 | 0.09 | −11.1 | 10⁵ | 0.49 |
| 6P | TNTT | 0.06 | −9.4 | 10⁴ | 0.15 |
| 6P | TNTT2 | 0.09 | −1.46 | 10⁴ | 0.26 |
| 6P | PhT2 | 0.05 | −3.69 | 10⁴ | 0.56 |
| 6P | PhT3 | 0.14 | −9.6 | 10⁵ | 0.46 |
| 6P | PhT4 | 0.08 | −9.4 | 10⁴ | 0.59 |
| 6P | PhTT | 0.07 | −8.5 | 10⁴ | 0.28 |
| 6P | PhTT2 | 0.10 | −4.5 | 10⁴ | 0.49 |
| BP2T | F₁₆CuPc | 0.12 | 7.1 | 10⁴ | 0.135 |
| BP2T | F₁₆CoPc | 0.15 | 8.6 | 10⁴ | 0.21 |
| BP2T | F₁₆ZnPc | 0.22 | 3.1 | 10⁴ | 0.134 |
| BP2T | F₁₆FePc | 0.18 | 10.2 | 10⁴ | 0.206 |
| BP2T | DHF-6T | 0.21 | 4.3 | 10⁴ | 0.15 |
| BP2T | CuPc | 0.02 | −5.6 | 10⁴ | 0.131 |
| BP2T | ZnPc | 0.06 | −3.2 | 10⁴ | 1.12 |
| BP2T | PtPc | 0.12 | −7.6 | 10⁴ | 0.94 |
| BP2T | PbPc | 0.21 | −5.3 | 10⁴ | 1.69 |
| BP2T | H₂Pc | 0.09 | −4.9 | 10⁴ | 1.09 |
| BP2T | Pentacene | 1.48 | −0.67 | 10⁵ | 1.28 |
| BP2T | NaT4 | 0.24 | −1.54 | 10⁵ | 0.84 |
| BP2T | TNT4 | 0.07 | −5.7 | 10⁴ | 0.68 |
| BP2T | TNT2 | 0.07 | −6.1 | 10⁴ | 0.64 |
| BP2T | TNTT2 | 0.06 | −9.4 | 10⁵ | 0.54 |
| BP2T | PhT4 | 0.10 | −12.4 | 10⁵ | 0.35 |
| BP2T | PhTT2 | 0.09 | −8.4 | 10⁵ | 0.49 |
| BP2T | 4T | 0.15 | −2.54 | 10⁵ | 1.24 |
| BP2T | 6T | 0.26 | −1.12 | 10⁵ | 0.67 |
| Pentacene | F₁₆CuPc | 0.14 | 2.5 | 10⁴ | 0.10 |
| Pentacene | F₁₆ZnPc | 0.16 | 5.4 | 10⁴ | 0.24 |
| Pentacene | CuPc | 0.21 | −4.5 | 10⁴ | 0.10 |
| Pentacene | ZnPc | 0.15 | −4.5 | 10⁴ | 0.69 |
| Pentacene | NaT4 | 0.24 | −7.5 | 10⁴ | 0.76 |
| Pentacene | TNT4 | 0.15 | −4.12 | 10⁴ | 0.76 |
| Pentacene | TNT2 | 0.09 | −4.7 | 10⁵ | 0.14 |
| Pentacene | TNTT2 | 0.07 | −6.4 | 10⁵ | 0.72 |
| Pentacene | PhT4 | 0.17 | −7.5 | 10⁵ | 0.73 |
| Pentacene | PhTT2 | 0.07 | −8.3 | 10⁵ | 0.97 |
| 6T | F₁₆CuPc | 0.15 | 7.5 | 10⁴ | 1.57 |
| 6T | F₁₆ZnPc | 0.24 | 9.4 | 10⁵ | 2.16 |
| 6T | CuPc | 0.16 | −5.8 | 10⁵ | 0.87 |
| 6T | ZnPc | 0.17 | −6.7 | 10⁵ | 0.75 |
| 6T | NaT4 | 0.23 | −1.58 | 10⁵ | 1.07 |
| 6T | TNT4 | 0.08 | −3.4 | 10⁴ | 0.57 |
| 6T | TNTT2 | 0.06 | −4.78 | 10⁴ | 0.78 |
| 6T | PhT3 | 0.04 | −8.9 | 10⁴ | 0.34 |
| 6T | PhTT | 0.07 | −4.87 | 10⁴ | 0.49 |
| NaT4 | F₁₆CuPc | 0.15 | 4.8 | 10⁴ | 1.57 |
| NaT4 | F₁₆ZnPc | 0.28 | 7.23 | 10⁴ | 1.48 |
| NaT4 | CuPc | 0.37 | −4.7 | 10⁵ | 1.73 |
| NaT4 | ZnPc | 0.29 | −5.6 | 10⁵ | 0.97 |
| NaT4 | PbPc | 0.16 | −7.5 | 10⁴ | 2.73 |
| NaT4 | TNT4 | 0.07 | −9.7 | 10⁴ | 0.12 |
| NaT4 | TNTT2 | 0.06 | −1.7 | 10⁴ | 0.43 |
| NaT4 | PhT4 | 0.06 | −7.7 | 10⁴ | 0.73 |
| NaT4 | PhTT2 | 0.098 | −1.57 | 10⁴ | 0.15 |
| Ph3 | F₁₆CuPc | 0.16 | 4.9 | 10⁵ | 1.51 |
| Ph3 | F₁₆ZnPc | 0.17 | 7.3 | 10⁵ | 0.94 |
| Ph3 | CuPc | 0.24 | −4.5 | 10⁴ | 1.74 |
| Ph3 | ZnPc | 0.34 | −1.57 | 10⁵ | 1.89 |
| Ph3 | NaT4 | 0.21 | −4.7 | 10⁵ | 0.49 |
| Ph3 | TNT4 | 0.13 | −7.7 | 10⁵ | 0.91 |
| Ph3 | TNT2 | 0.08 | −13.4 | 10⁴ | 0.18 |
| Ph3 | TNTT2 | 0.05 | −4.5 | 10⁴ | 0.78 |
| Ph3 | PhT4 | 0.09 | −4.7 | 10⁵ | 0.73 |
| Ph3 | PhTT2 | 0.071 | −7.9 | 10⁴ | 0.27 |

Example 7

The materials and process methods used in this Example were same as those in Example 2.

The device structure using an organic transistor was shown in FIG. 4B. The process methods of substrate 1 and gate electrode 2 were same as those in Example 2. Then, a 60 nm Au layer was deposited on insulator layer 3 using vacuum thermal deposition method, and source and drain electrodes 6 were formed, wherein the vacuum degree in thermal deposition was $10^{-4}$ Pa. Next, an organic semiconductor ordered mono-molecular layer 4 was deposited on the insulation layer 3 and source and drain electrodes 6 using molecular vapor phase deposition method, thus constituting an ordered substrate, under a vacuum degree of $10^{-4}$ Pa. Finally, a continuous organic semiconductor crystalline film (5) having a thickness of 40 nm was deposited continuously on the ordered substrate, with the same deposition method and conditions as above. Also, the organic semiconductor ordered mono-molecular layer 4 and the organic semiconductor crystalline film 5 herein could be either the abovementioned n-type semiconductor or the abovementioned p-type semiconductor.

Performances of devices assembled by different semiconductors and their photo responses under light illuminating are listed in Table 2.

TABLE 2

| Ordered mono-molecular layer 4 | Semiconductor crystalline film 5 | Mobility (cm²/V s) | Threshold voltage (V) | On/off current ratio | Photo-sensitivity (A/W) |
|---|---|---|---|---|---|
| 6P | F₁₆CuPc | 0.10 | 7.8 | 10⁴ | 0.145 |
| 6P | F₁₆CoPc | 0.08 | 6.4 | 10⁴ | 0.157 |
| 6P | F₁₆ZnPc | 0.12 | 8.7 | 10⁴ | 0.437 |
| 6P | DHF-6T | 0.13 | 4.5 | 10⁴ | 0.25 |
| 6P | CuPc | 0.13 | −10.1 | 10⁵ | 0.67 |
| 6P | ZnPc | 0.24 | −7.7 | 10⁵ | 1.45 |
| 6P | PbPc | 0.13 | −4.38 | 10⁴ | 2.61 |
| 6P | H₂Pc | 0.01 | −15.7 | 10⁴ | 1.12 |
| 6P | Pentacene | 1.1 | −5.4 | 10⁵ | 1.67 |
| 6P | BP2T | 0.01 | −4.4 | 10⁵ | 0.36 |
| 6P | 5T | 0.09 | −7.87 | 10⁵ | 1.04 |
| 6P | 6T | 0.15 | −9.7 | 10⁵ | 0.91 |
| 6P | NaT4 | 0.11 | −8.7 | 10⁵ | 1.01 |
| 6P | NaT6 | 0.09 | −10.4 | 10⁴ | 0.45 |
| 6P | NaTT | 0.07 | −12.4 | 10⁴ | 0.14 |
| 6P | NaTT2 | 0.14 | −10.5 | 10⁵ | 0.42 |
| 6P | TNT4 | 0.11 | −13.4 | 10⁴ | 0.17 |
| 6P | TNT2 | 0.06 | −16.7 | 10⁵ | 0.48 |
| 6P | TNTT | 0.05 | −13.4 | 10⁴ | 0.07 |
| 6P | TNTT2 | 0.07 | −12.6 | 10⁵ | 0.15 |
| 6P | PhT2 | 0.03 | −9.7 | 10⁴ | 0.45 |
| 6P | PhT4 | 0.05 | −13.7 | 10⁴ | 0.15 |
| 6P | PhTT | 0.034 | −9.7 | 10⁴ | 0.34 |
| 6P | PhTT2 | 0.06 | −6.7 | 10⁴ | 0.24 |
| BP2T | F₁₆CuPc | 0.08 | 13.7 | 10⁴ | 0.21 |

TABLE 2-continued

| Ordered mono-molecular layer 4 | Semiconductor crystalline film 5 | Mobility ($cm^2/V\ s$) | Threshold voltage (V) | On/off current ratio | Photo-sensitivity (A/W) |
|---|---|---|---|---|---|
| BP2T | $F_{16}ZnPc$ | 0.12 | 9.4 | $10^4$ | 0.15 |
| BP2T | DHF-6T | 0.14 | 10.6 | $10^5$ | 0.21 |
| BP2T | CuPc | 0.01 | −16.3 | $10^4$ | 0.11 |
| BP2T | ZnPc | 0.04 | −12.1 | $10^4$ | 0.94 |
| BP2T | PbPc | 0.10 | −10.4 | $10^4$ | 1.26 |
| BP2T | Pentacene | 1.14 | −3.71 | $10^4$ | 1.18 |
| BP2T | NaT4 | 0.12 | −11.5 | $10^4$ | 0.13 |
| BP2T | TNT4 | 0.04 | −12.5 | $10^4$ | 0.81 |
| BP2T | TNTT2 | 0.05 | −14.6 | $10^5$ | 0.28 |
| BP2T | PhT3 | 0.07 | −16.4 | $10^5$ | 0.15 |
| BP2T | PhTT2 | 0.062 | −11.4 | $10^5$ | 0.43 |
| BP2T | 6T | 0.13 | −11.6 | $10^5$ | 0.75 |
| Pentacene | $F_{16}CuPc$ | 0.08 | 4.2 | $10^4$ | 0.06 |
| Pentacene | $F_{16}ZnPc$ | 0.11 | 3.4 | $10^4$ | 0.15 |
| Pentacene | CuPc | 0.15 | −7.5 | $10^4$ | 0.67 |
| Pentacene | ZnPc | 0.14 | −9.8 | $10^4$ | 0.16 |
| Pentacene | NaT4 | 0.12 | −6.7 | $10^5$ | 1.51 |
| Pentacene | TNT4 | 0.08 | −5.3 | $10^4$ | 0.15 |
| Pentacene | TNTT2 | 0.05 | −4.7 | $10^5$ | 0.98 |
| Pentacene | PhT4 | 0.07 | −6.1 | $10^5$ | 0.77 |
| Pentacene | PhTT2 | 0.07 | −8.3 | $10^4$ | 0.45 |
| 6T | $F_{16}CuPc$ | 0.121 | 3.4 | $10^4$ | 1.37 |
| 6T | $F_{16}ZnPc$ | 0.16 | 6.4 | $10^5$ | 1.73 |
| 6T | CuPc | 0.12 | −10.4 | $10^4$ | 0.73 |
| 6T | ZnPc | 0.13 | −7.7 | $10^4$ | 0.16 |
| 6T | NaT4 | 0.15 | −5.8 | $10^4$ | 0.76 |
| 6T | TNT4 | 0.07 | −14.2 | $10^4$ | 0.37 |
| 6T | TNTT2 | 0.05 | −12.4 | $10^4$ | 0.73 |
| 6T | PhT3 | 0.01 | −16.8 | $10^4$ | 0.156 |
| 6T | PhTT | 0.03 | −12.5 | $10^4$ | 0.73 |
| NaT4 | $F_{16}CuPc$ | 0.11 | 7.8 | $10^4$ | 0.97 |
| NaT4 | $F_{16}ZnPc$ | 0.15 | 8.9 | $10^4$ | 0.73 |
| NaT4 | CuPc | 0.13 | −10.5 | $10^5$ | 0.98 |
| NaT4 | ZnPc | 0.17 | −12.4 | $10^5$ | 0.76 |
| NaT4 | PbPc | 0.12 | −9.7 | $10^5$ | 1.54 |
| NaT4 | TNT4 | 0.03 | −14.3 | $10^4$ | 0.43 |
| NaT4 | TNTT2 | 0.012 | −14.4 | $10^4$ | 0.73 |
| NaT4 | PhT4 | 0.04 | −11.4 | $10^4$ | 0.45 |
| NaT4 | PhTT2 | 0.05 | −10.4 | $10^4$ | 0.47 |
| Ph3 | $F_{16}CuPc$ | 0.11 | 6.4 | $10^4$ | 0.73 |
| Ph3 | $F_{16}ZnPc$ | 0.09 | 8.4 | $10^4$ | 0.37 |
| Ph3 | CuPc | 0.16 | −13.7 | $10^5$ | 1.12 |
| Ph3 | ZnPc | 0.21 | −12.4 | $10^5$ | 1.34 |
| Ph3 | NaT4 | 0.14 | −11.8 | $10^5$ | 0.78 |
| Ph3 | TNT4 | 0.07 | −15.7 | $10^5$ | 0.97 |
| Ph3 | TNT2 | 0.05 | −16.7 | $10^4$ | 0.31 |
| Ph3 | TNTT2 | 0.02 | −9.7 | $10^4$ | 0.45 |
| Ph3 | PhT4 | 0.034 | −12.4 | $10^4$ | 0.67 |
| Ph3 | PhTT2 | 0.05 | −10.4 | $10^4$ | 0.13 |

Example 8

The materials and process methods used in this Example were same as those in Example 2. A soluble p-type organic semiconductor, bi(3,3'''-dilauryl-2,2':5',2'':5'',2'''-tetrathiophene) (BQT-12) was synthesized according to reference document (J. Am. Chem. Soc., 2004, 126, 3378). A soluble p-type organic semiconductor, tri(3,3'''-dilauryl-2,2':5',2'':5'',2'''-tetrathiophene) (TQT-12) was synthesized according to reference documents (Adv. Mater., 1999, 11, 1378; Chem. Mater., 2003, 15, 4352; and Synthesis, 1993, 1099).

The device structure using an organic transistor was shown in FIG. 4B. The process methods of substrate 1 and gate electrode 2 were same as those in Example 2. Then, an organic semiconductor 6P ordered mono-molecular layer 4 was deposited on insulation layer 3 and source and drain electrodes 6 using molecular vapor phase deposition method, thus constituting an ordered substrate. Next, a 0.5 wt % chloroform solution of TQT-12 or BQT-12 was dropped or inkjet printed onto the ordered substrate. After the solvent being volatilized, an anneal treatment was performed for 20 minutes, thereby forming an organic semiconductor crystalline film 5.

Performances of devices assembled by different semiconductors and their photo responses under light illumination are listed in Table 3.

TABLE 3

| Ordered mono-molecular layer 4 | Semiconductor crystalline film 5 | Mobility ($cm^2/V\ s$) | Threshold voltage (V) | On/off current ratio | Photo-sensitivity (A/W) |
|---|---|---|---|---|---|
| 6P | BQT-12 | 0.06 | −7.54 | $10^5$ | 1.54 |
| 6P | TQT-12 | 0.072 | −5.7 | $10^4$ | 0.97 |
| Ph3 | BQT-12 | 0.08 | −10.4 | $10^4$ | 1.67 |
| Ph3 | TQT-12 | 0.061 | −8.4 | $10^5 10^4$ | 1.24 |
| NaT4 | BQT-12 | 0.04 | −9.5 | $10^5$ | 0.75 |
| NaT4 | TQT-12 | 0.05 | −11.4 | $10^5$ | 0.34 |
| 6T | BQT-12 | 0.03 | −5.4 | $10^4$ | 0.47 |
| 6T | TQT-12 | 0.042 | −6.44 | $10^4$ | 1.15 |
| Pentacene | BQT-12 | 0.07 | −9.42 | $10^5$ | 0.98 |
| Pentacene | TQT-12 | 0.05 | −8.45 | $10^4$ | 0.46 |
| BP2T | BQT-12 | 0.45 | −7.53 | $10^4$ | 0.76 |
| BP2T | TQT-12 | 0.64 | −4.21 | $10^5$ | 1.21 |

The present invention is not limited to the above Examples. Generally, the organic semiconductor crystalline films prepared by the weak oriented epitaxy growth method according to the present invention are useful in other organic semiconductor members, and are members for forming two-dimensional and three-dimensional integrated devices. These integrated devices are applicable in flexible integrated circuits, active matrix displays and photovoltaic cells. A low-temperature machining can be achieved by using the electronic members according to the present invention.

What is claimed is:

1. An organic semiconductor crystalline film consisting of organic semiconductor molecules, wherein the organic semiconductor molecules in said organic semiconductor crystalline film are arranged in a stand-up manner on an ordered substrate and have oriented relationship with the ordered substrate;
   wherein the ordered substrate comprises a substrate and a p-type organic semiconductor ordered molecular layer formed by a molecular vapor phase deposition process, and
   the organic semiconductor crystalline film is formed by a weak oriented epitaxially grown process such that the organic semiconductor molecules are arranged in a stand-up manner on the ordered molecular layer of the ordered substrate;
   wherein the ordered molecular layer is a p-type organic semiconductor ordered multi-molecular layer;
   wherein the ordered molecular layer comprises one of BP2T, NaT4, pentacene, hexathiophene, para-hexaphenyl (6P) or triphenanthrene.

2. An organic semiconductor crystalline film consisting of organic semiconductor molecules, wherein the organic semiconductor molecules in said organic semiconductor crystalline film are arranged in a stand-up manner on an ordered substrate and have oriented relationship with the ordered substrate;
   wherein the ordered substrate comprises a substrate and a p-type organic semiconductor ordered molecular layer formed by a molecular vapor phase deposition process, and the organic semiconductor crystalline film is formed by a weak oriented epitaxially grown process such that the organic semiconductor molecules are arranged in a stand-up manner on the ordered molecular layer of the ordered substrate;

wherein the ordered molecular layer is a p-type organic semiconductor ordered mono-molecular layer, said ordered-mono-molecular layer being continuous or discontinuous;

wherein the ordered molecular layer comprises one of BP2T, NaT4, pentacene, hexathiophene, para-hexaphenyl (6P) or triphenanthrene.

3. An organic semiconductor crystalline film consisting of organic semiconductor molecules, wherein the organic semiconductor molecules in said organic semiconductor crystalline film are arranged in a stand-up manner on an ordered substrate and have oriented relationship with the ordered substrate;

wherein the ordered substrate comprises a substrate and a p-type organic semiconductor ordered molecular layer formed by a molecular vapor phase deposition process, and the organic semiconductor crystalline film is formed by a weak oriented epitaxially grown process such that the organic semiconductor molecules are arranged in a stand-up manner on the ordered molecular layer of the ordered substrate;

the organic semiconductor ctystalline film using one or two materials selected from p-type semiconductor materials including copper phthalocyanine (CuPc), zinc phthalocyanine (ZnPc), nickel phthalocyanine (NiPc), cobalt phthalocyanine (CoPc), free phthalocyanine ($H_2Pc$), platinum phthalocyanine (PtPc), lead phthalocyanine (PbPc), Pentacene, 6P, BP2T, 5,5'-di(2-naphthyl)-2,2'-dithiophene (NaT2), 5,5''-di(2-naphthyl)-2,2':5',2''-trithiophene (NaT3), NaT4,5,5''''-di(2-naphthyl)-2,2':5',2'':5''',2''''-pentathiophene (NaT5), 5,5'''''-di(2-naphthyl)-2,2':5',2'':5''',2'''':5'''''',2''''''-hexathiophene (NaT6), 2,5-di(2-naphthyl)-[3,2-b]bidithiophene (NaTT), 5,5'-di(2-naphthyl)-2,2'-di[3,2-b]bidithiophene (NaTT2), 5,5'-di(2-thianaphthenyl)-2,2'-dithiophene (TNT2), 5,5''-di(2-thianaphthenyl)-2,2':5',2''-trithiophene (TNT3), 5,5'''-di(2-thianaphthenyl)-2,2':5',2'':5''',2'''-tetrathiophene (TNT4), 5,5''''-di(2-thianaphthenyl)-2,2':5',2'':5''',2''':5'''', 2''''-pentathiophene (TNT5), 2,5-di(2-thianaphthenyl)-[3,2-b]bidithiophene (TNTT), 5,5'-di(2-thianaphthenyl)-2,2'-di[3,2-b]bidithiophene (TNTT2), 5,5'-di(2-phenanthryl)-2,2'-dithiophene (PhT2), 5,5''-di(2-phenanthryl)-2,2':5',2''-trithiophene (PhT3), 5,5'''-di(2-phenanthryl)-2,2':5',2'':5''',2'''-tetrathiophene (PhT4), 2,5-di(2-phenanthryl)-[3,2-b]bidithiophene (PhTT), or 5,5'-di(2-phenanthryl)-2,2'-di[3,2-b]bidithiophene (PhTT2), and n-type semiconductor material including copper fluorophthalocyanine ($F_{16}CuPc$), zinc fluorophthalocyanine ($F_{16}ZnPc$), iron fluorophthalocyanine ($F_{16}FePc$), cobalt fluorophthalocyanine ($F_{16}CoPc$) or fluoro-hexathiophene (DFH-6T).

4. An organic semiconductor film structure comprising:
an organic semiconductor polycrystalline film; and,
an ordered substrate having an ordered organic molecular layer formed on a substrate;

wherein the organic semiconductor polycrystalline film is formed on the ordered organic molecular layer of the ordered substrate and has an oriented relationship with the ordered organic molecular layer, wherein the organic semiconductor molecules in said organic semiconductor polycrystalline film are arranged in a stand-up manner on the ordered substrate, and a fixed angles relationship is defined between a crystal axis of crystal in the organic semiconductor polycrystalline film and a crystal axis of orderly arranged organic molecules in the ordered organic molecular layer;

wherein the ordered organic molecular layer comprises a two-dimensional ordered structure in a plane parallel to the substrate, said two-dimensional ordered structure being characterized by corresponding diffraction pattern in a selected area electron diffraction spectrum.

5. An organic semiconductor system comprising:
(a) an ordered substrate having an ordered organic molecular layer formed on a substrate; and,
(b) an organic semiconductor polycrystalline film formed on said ordered substrate, the organic semiconductor polycrystalline film having an oriented relationship with the ordered organic molecular layer, wherein semiconductor molecules in said organic semiconductor polycrystalline film are arranged in a stand-up manner on the ordered substrate, and a fixed angle relationship is defined between a crystal axis of crystal in the organic semiconductor polycrystalline film and a crystal axis of orderly arranged organic molecules in the ordered organic molecular layer;

wherein the ordered organic molecular layer comprises a two-dimensional ordered structure in a plane parallel to the substrate, said two-dimensional ordered structure being characterized by corresponding diffraction pattern in a selected area electron diffraction spectrum.

6. The organic semiconductor film structure as recited in claim 4, wherein the ordered organic molecular layer an organic semiconductor ordered mono-molecular layer or an organic semiconductor ordered multi-molecular layer.

7. The organic semiconductor system as recited in claim 5, wherein the ordered organic molecular layer an organic semiconductor ordered mono-molecular layer or an organic semiconductor ordered multi-molecular layer.

* * * * *